(12) United States Patent
Abe

(10) Patent No.: US 7,646,050 B2
(45) Date of Patent: Jan. 12, 2010

(54) FERROELECTRIC TYPE SEMICONDUCTOR DEVICE HAVING A BARRIER TIO AND TION TYPE DIELECTRIC FILM

(75) Inventor: Kazuhide Abe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 321 days.

(21) Appl. No.: 11/306,387

(22) Filed: Dec. 27, 2005

(65) Prior Publication Data

US 2006/0220083 A1  Oct. 5, 2006

(30) Foreign Application Priority Data

Jan. 26, 2005  (JP)  ............................. 2005-018390

(51) Int. Cl.
H01L 21/70    (2006.01)
H01L 21/02    (2006.01)
H01L 27/115   (2006.01)
H01L 21/8246  (2006.01)

(52) U.S. Cl. .............................. 257/295; 257/E21.009; 257/E21.664; 257/E27.104; 361/321.5

(58) Field of Classification Search ................ 257/306, 257/295, E21.009, E21.279, E21.664, E27.104; 361/321.5

See application file for complete search history.

(56) References Cited

U.S. PATENT DOCUMENTS

| | | | | |
|---|---|---|---|---|
| 5,976,928 A | * | 11/1999 | Kirlin et al. | 438/240 |
| 6,057,237 A | * | 5/2000 | Ding et al. | 438/687 |
| 6,229,167 B1 | * | 5/2001 | Ozawa | 257/295 |
| 6,352,898 B2 | * | 3/2002 | Yang et al. | 438/298 |
| 6,455,418 B1 | * | 9/2002 | Bhowmik et al. | 438/643 |
| 6,737,697 B2 | * | 5/2004 | Kutsunai et al. | 257/306 |

FOREIGN PATENT DOCUMENTS

JP  10/256503 A  9/1998

* cited by examiner

Primary Examiner—Zandra Smith
Assistant Examiner—Tsz K Chiu
(74) Attorney, Agent, or Firm—Rabin & Berdo, PC

(57) ABSTRACT

A semiconductor device includes a semiconductor substrate, a first electrode that is formed over said semiconductor substrate, a capacitive insulating film that is formed on the first electrode and is made of a metal oxide ferroelectric, a second electrode that is formed on the capacitive insulating film, an insulating film that has a first opening exposing a portion of an upper side of the second electrode and is formed so that it covers the first electrode, the capacitive insulating film, and the second electrode, a first barrier film having an amorphous structure which is formed inside the first opening and on the insulating film, and a wiring film that is formed over the first barrier film.

5 Claims, 23 Drawing Sheets

RELATIONSHIP BETWEEN PEAK INTENSITY OF Al AND Pt
AND TiN OXIDATION TREATMENT
(AFTER HEAT TREATMENT (400°C/30 min)

FERROELECTRIC TYPE SEMICONDUCTOR DEVICE HAVING A BARRIER TIO AND TION TYPE DIELECTRIC FILM

BACKGROUND OF THE INVENTION

1. Field of the Invention

The present invention relates to a semiconductor device with a wiring structure having good electrical properties in a connection with a capacitor that uses a metal-oxide dielectric.

A ferroelectric random access memory (FeRAM) is a high-speed nonvolatile memory using the hysteresis property of a ferroelectric material. A FeRAM has excellent features, such as high-speed read/write operations that are as fast as a dynamic random access memory (DRAM) and lower power consumption, for instance.

When a capacitor is formed with a ferroelectric material of a metal oxide, an annealing treatment in an oxygen atmosphere at a high temperature (600-800 degrees Celsius) is required to recover the properties of the ferroelectric material after sintering or etching. Because of this, precious metal such as platinum (Pt) or iridium (Ir) having excellent oxidization resistance properties is used for the upper and lower electrodes adjacent to a ferroelectric. Especially, Pt is best used for the electrodes in consideration of process-stability and workability.

Japanese Patent Publication JP-A-10-256503 (especially pages 5-8 and FIG. 1) shows a semiconductor device with a ferroelectric capacitor. In this semiconductor device, aluminum (Al) and Pt are used for the main wiring material and the main electrode material, respectively. In general, it is known that Al and Pt excessively yield chemical reactions. A void is formed in an Al wiring in these chemical reactions. Also, if much chemical reactions are provoked, the Al wiring pattern will be separated. Therefore, an anti-reaction layer is formed on a capacitor electrode in order to prevent chemical reactions between Al and Pt.

2. Background Information

As described above, Pt, which is used for an electrode material of a ferroelectric capacitor, chemically reacts with Al, which is a general wiring material, and an $Al_2Pt$ compound is produced. As a result, a void is formed in Al wiring. Also, if a large number of chemical reactions are provoked, the Al wiring pattern will separate. Therefore, it is common to form a barrier film such as titanium nitride (TiN) between a Pt electrode and the Al wiring. However, the crystal structure of TiN is a columnar crystal structure. Therefore, Al atoms can easily spread through the crystal grains of TiN to a surface of the Pt electrode. One of the countermeasures for this could be to improve the barrier properties by lengthening the diffusion path of Al by forming a thick TiN film. However, if a thick TiN film is formed with a method such as sputtering, an overhang growth of TiN will be enhanced on a contact hole used to connect a capacitor electrode with wiring. Also, Al, a wiring material, cannot be implanted into a contact hole sufficiently. Therefore, deterioration of the electrical properties will be provoked. Thus, a sufficient barrier effect cannot be obtained just by forming a TiN barrier film on an interface between a Pt electrode and Al wiring.

The semiconductor device described in Japanese Patent Publication JP-A-10-256503 includes an anti-reaction layer between the Pt electrode and the Al wiring of a capacitor. In other words, it includes a barrier layer, a stopper layer, and an adhesion layer. However, this anti-reaction layer is formed on a capacitor electrode, and integrated with a capacitor electrode. Therefore, the thickness of the electrode itself can be increased, and eventually the thickness of the whole semiconductor device structure can be increased. Also, in this semiconductor device, a contact hole used to connect a capacitor electrode with wiring is etched after the anti-reaction layer is formed. However, the dielectric film is damaged in this etching process. Therefore, an anneal in an oxygen atmosphere at a high temperature is normally conducted to recover the properties of the dielectric film, although this is not described in Japanese Patent Publication JP-A-10-256503. However, there is a possibility that the anti-reaction layer already formed will be oxidized, its electrical properties will be reduced, and the anti-reaction layer will be separated in this anneal treatment. Also, in this semiconductor device, a stacked capacitor structure is employed, and an anti-reaction layer is formed only on an upper electrode of a capacitor. If a contact needs to be formed upward from both upper and lower electrodes of a capacitor, an anti-reaction layer needs to be formed for a lower electrode. However, forming an anti-reaction layer for a lower electrode is not described in this patent publication.

In view of the above, it will be apparent to those skilled in the art from this disclosure that there exists a need for an improved method for manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problem, and to provide a semiconductor device which inhibits chemical reactions between the Al of a wiring film and the Pt of an electrode, and prevents the thickness of the whole device from being increased. A semiconductor device in accordance with the present invention comprises a semiconductor substrate, a first electrode that is formed over said semiconductor substrate, a capacitive insulating film that is formed on said first electrode and which comprises a metal oxide ferroelectric, a second electrode that is formed on said capacitive insulating film, an insulating film that has a first opening exposing a portion of an upper side of said second electrode and is formed so as to cover said first electrode, said capacitive insulating film, and said second electrode, a first barrier film with an amorphous structure which is formed inside said first opening and on said insulating film, and a wiring film that is formed over said first barrier film.

The semiconductor device in accordance with the present invention includes an amorphous structure, that is, a first barrier film having a structure in which a crystal grain boundary does not exist, between a second electrode (i.e., an upper electrode of a capacitor) and a wiring film. Because of this, the diffusion of Al, the main material of a wiring film, can be prevented, and chemical reactions between Al and Pt (the material of an electrode) can be effectively inhibited. Also, in the semiconductor device of the present invention, a first barrier is formed as a portion of a wiring structure. Therefore, surface unevenness is not encouraged, and the thickness of the whole structure is not increased, by forming a first barrier film.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
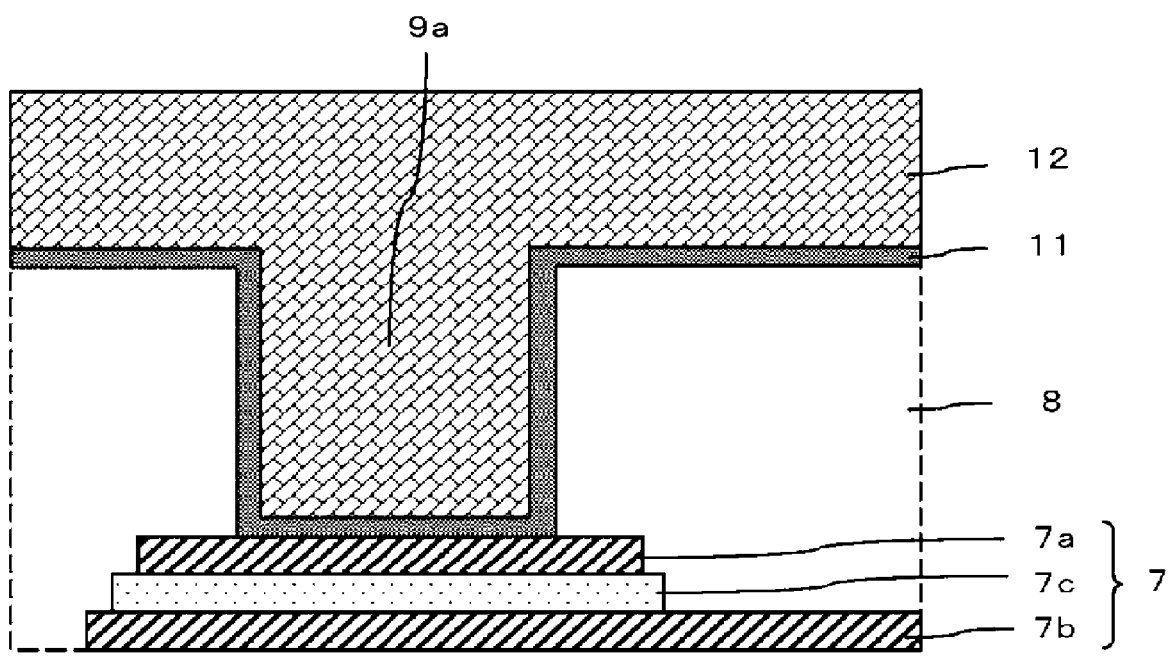
FIG. 1 is a schematic diagram showing the structure of a ferroelectric capacitor and its wiring structure used in a semiconductor device in accordance with a first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Referring now to the drawings, preferred embodiments of the present invention will be described in detail.

First Embodiment

Capacitor Structure and Wiring Structure

FIG. 1 is a schematic diagram showing a ferroelectric capacitor and its wiring structure in a semiconductor device in accordance with a first embodiment of the present invention.

An upper electrode 7a and a lower electrode 7b are capacitor electrodes composed of material with excellent oxidation resistance. For example, the material consists primarily of Pt. A capacitive insulating film 7c is a metal-oxide ferroelectric. For example, it is comprised of strontium bismuth tantalum oxide (SBT or $SrBi_2Ta_2O_9$). A ferroelectric capacitor 7 is comprised of a laminated structure of the lower electrode 7b, the capacitive insulating film 7c formed on the lower electrode 7b, and the upper electrode 7a formed on the capacitive insulating film 7c.

An insulating film 8 is an interlayer insulating film that covers the ferroelectric capacitor 7. For example, it is comprised of a silicon dioxide film. A contact 9a is a connector for electrically connecting the ferroelectric capacitor 7 and external elements. The contact 9a is formed so as to be in contact with the upper electrode 7a through a barrier film 11 as a portion of a wiring film 12 formed on the insulating film 8. The barrier film 11 is a conducting film with an amorphous structure to inhibit chemical reactions between the upper electrode 7a and the wiring film 12. It is required to be formed so as to be located between the upper electrode 7a and the wiring film 12 at the bottom of the contact 9a. The barrier film 11 is comprised of tantalum nitride (TaN) with an amorphous structure. Also, when TaN is amorphized, the value of its resistance increases. Therefore, it is also possible to form a structure that reduces resistance by reducing the thickness of the TaN film and then laminating a metal-nitride film such as titanium nitride (TiN), zirconium nitride (ZrN), and tungsten nitride (WN) on the TaN film. The wiring film 12 is a conducting film that electrically connects the ferroelectric capacitor 7 and external elements. For example, it is primarily comprised of aluminum (Al).

Thus, in the ferroelectric capacitor and its wiring structure in accordance with the first embodiment of the present invention, the barrier film 11 comprised of TaN with an amorphous structure is formed between the upper electrode 7a comprised of Pt and the wiring film 12 mainly comprised of Al. Because of this, Al will be effectively inhibited from reaching a surface of the Pt electrode without forming a crystal grain boundary through which the Al in the barrier film can easily diffuse.

Manufacturing Method

FIGS. 2A to 2C, 3A to 3C, and 4A to 4C are simple cross-section diagrams of a portion of a semiconductor device having the ferroelectric capacitor and wiring structure (i.e., a ferroelectric memory cell 100) shown in FIG. 1, in order of its manufacturing process.

Figure 2A:
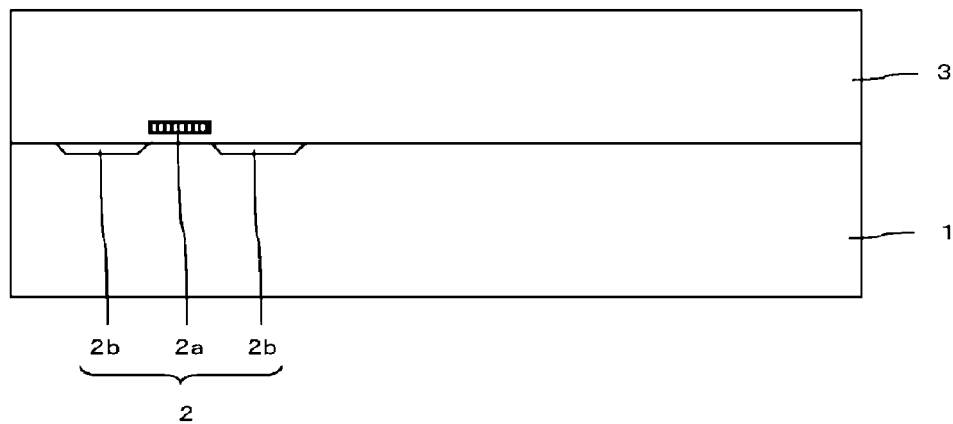
FIGS. 2A to 2C are diagrams showing steps of forming a semiconductor device in accordance with the first embodiment of the present invention.

First, as shown in FIG. 2A, a MOS transistor 2 is formed on a semiconductor substrate 1. The MOS transistor 2 includes a gate electrode 2a and a diffusion layer 2b including source and drain regions. Also, the MOS transistor 2 shown in FIG. 2A is shown without a portion of its components as a matter of convenience in explanation. Next, an insulating film 3 is formed on the semiconductor substrate 1 where the MOS transistor 2 is formed. The insulating film 3 is formed through the following process. First, a boron phosphorous silicate glass (BPSG) film of 1200 nm in thickness is deposited with the chemical vapor deposition (CVD) method. Then, it is planarized by reflowing it with a heat treatment in a $N_2$ atmosphere at 850 degrees Celsius for 20 minutes. Next, spin on glass (SOG) of 470 nm in thickness is applied on the BPSG film, and its entire surface is etch-backed. Though this process, the insulating film 3 of 850 nm in thickness is formed. For example, octafluocyclobutane ($C_4F_8$), argon (Ar), oxygen ($O_2$), and carbon monoxide (CO) are used as an etch-back gas. The etch-back conditions are set as follows. For example, gas flow rates of $C_4F_8$, Ar, $O_2$, and CO are set to be 14, 100, 150, and 150 sccm, respectively. The RF power is set to be 1.5 kW. The chamber pressure is set to be 50 mTorr.

Figure 2B:
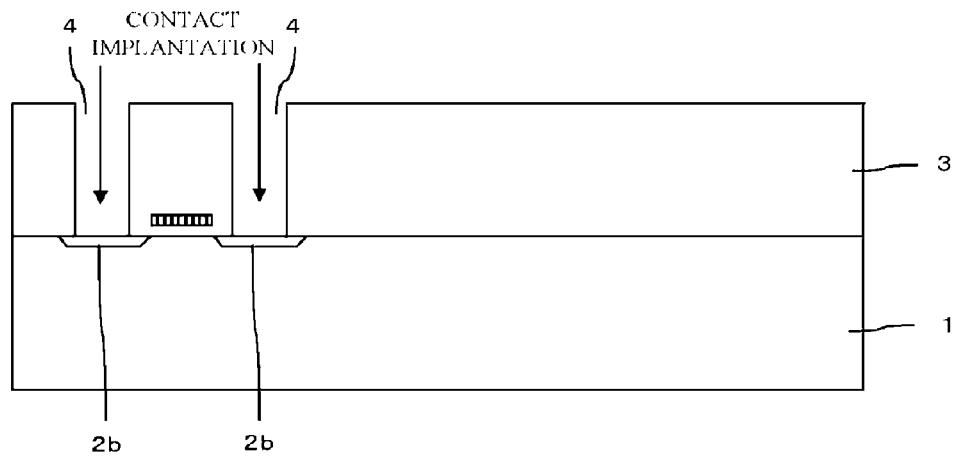

Next, as shown in FIG. 2B, a contact hole 4 is formed with photolithography and etching. The contact hole 4 exposes a portion of the diffusion layer 2b of the source and drain regions in the MOS transistor 2. For example, trifluomethane ($CHF_3$), carbon tetrafluoride ($CF_4$), and argon (Ar) are used as the etching gas. The etching conditions are set as follows. For example, gas flow rates of $CHF_3$, $CF_4$, and Ar are set to be 40, 15, and 400 sccm, respectively. The RF power is set to be 800 W. The chamber pressure is set to be 500 mTorr. Next, contact implantation of P+ and $BF_2$+ is conducted, and then a heat treatment is conducted at 1000 degrees Celsius for 10 seconds.

Figure 2C:
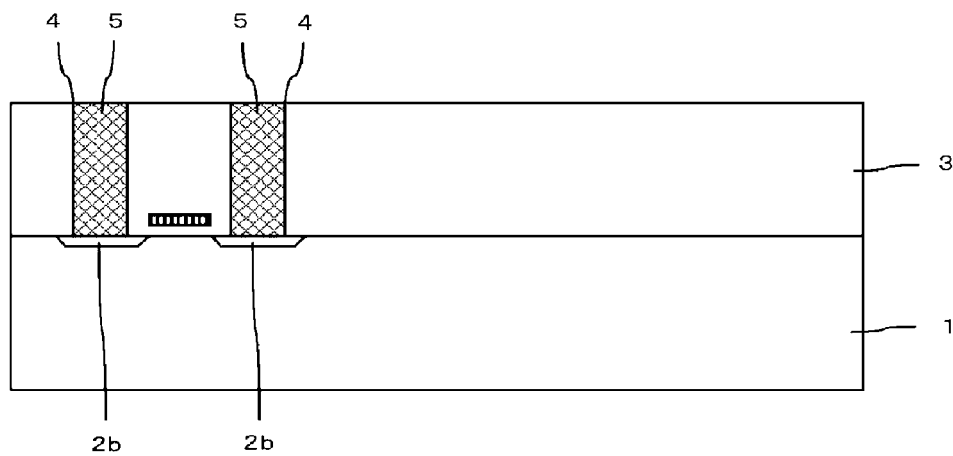

Next, as shown in FIG. 2C, a plug 5 is formed in the contact hole 4. It is formed though the following process. First, a laminated film comprised of Ti and TiN is formed with the CVD method. Thickness of the Ti film and the TiN film are 15 nm and 20 nm, respectively. The Ti film is formed as follows. For example, titanium tetrachloride ($TiCl_4$), argon (Ar), and hydrogen ($H_2$) are used as a gas to form the Ti film. The conditions for forming the Ti film are set as follows. For example, the gas flow rates of $TiCl_4$, Ar, and $H_2$ are set to be 5, 350, 1500 sccm, respectively. The RF power is set to be 350 W. The chamber pressure is set to be 5 Torr. The stage temperature is set to be 630 degrees Celsius. After Ti is deposited, a nitriding treatment is conducted in the same chamber. The conditions for the nitriding treatment are set as follows. For example, ammonia ($NH_3$), $N_2$, and Ar are used as the gas for the nitriding treatment. Gas flow rates of $NH_3$, $N_2$, and Ar is set to be 500, 250, and 350 sccm, respectively. The RF power is set to be 500 W. The chamber pressure is set to be 5 Torr. The stage temperature is set to be 630 degrees Celsius. On the other hand, the TiN film is formed as follows. For example, $TiCl_4$, $NH_3$, and Ar are used as a gas to form the Ti film. The conditions for forming the Ti film are set as follows. Gas flow rates of $TiCl_4$, $NH_3$, and Ar are set to be 35, 400, and 350 sccm, respectively. The chamber pressure is set to be 300 mTorr. The stage temperature is set to be 680 degrees Celsius. After the TiN film is deposited, a heat treatment is conducted in the same chamber in order to eliminate chlorine in the TiN film and reduce its resistance. The conditions for the heat treatment are set as follows. For example, $NH_3$ and $N_2$ are used as the heat treatment gas. Gas flow rates of $NH_3$ and $N_2$ are set to be 4000 and 400 sccm, respectively. The chamber pressure is set to be 8 Torr. The stage temperature is set to be 680 degrees Celsius. Thus, the Ti film and the TiN film are formed. Next, a tungsten (W) film of 600 nm in thickness is formed on the TiN film with the CVD method. The W film is formed with two steps. In the first step of forming a W film, tungsten hexafluoride ($WF_6$) and mono silane ($SiH_4$) are used, for instance. The conditions for forming a W film are set as follows. For example, gas flow rates of $WF_6$ and $SiH_4$ are set to be 300 and 100 sccm, respectively. The chamber pressure is set to be 300 mTorr. The stage temperature is set to be 400 degrees Celsius. In the second step of forming a W film, $WF_6$ and $H_2$ are used, for instance. The conditions for forming the W film are set as follow. For example, gas flow rates of $WF_6$ and $H_2$ are set to be 500 and 6500 sccm, respectively. The chamber pressure is set to be 30 Torr. The stage temperature is set to be 400 degrees Celsius. In this phase, a laminated film comprised of Ti, TiN, and W is formed. Then, etch-back is conducted for the laminated film and thus a plug 5 is formed. For example, sulfur hexafluoride ($SF_6$) and $O_2$ are used for the etch-back. An etch-back condition is set as follows. For example, gas flow rates of $SF_6$ and $O_2$ are set to be 250 and 50 sccm, respectively. A RF power is set to be 300 W. The chamber pressure is set to be 150 mTorr.

Figure 3A:
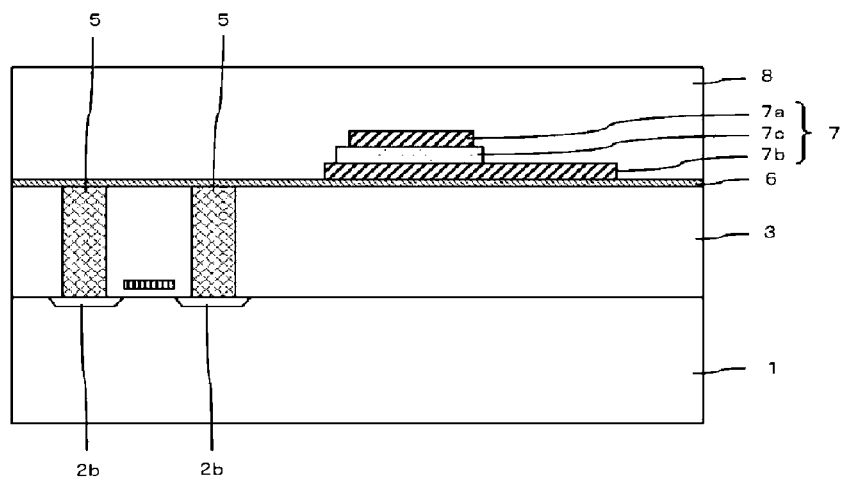
FIGS. 3A to 3C are diagrams showing steps of forming a semiconductor device in accordance with the first embodiment of the present invention.

Next, as shown in FIG. 3A, a ferroelectric capacitor 7 is formed. First, an insulating film 6 is formed on the insulating film 3 with the sputtering method. The insulating film 6 is an adhesion layer for an upper electrode 7b of the ferroelectric capacitor 7 which is described later. For example, the insulating film 6 is comprised of tantalum oxide ($Ta_xO_y$). Also, Ta is used as a sputtering target and a mixed gas of Ar and $O_2$ is used as a sputtering gas to form a $Ta_xO_y$ film. The conditions for forming the insulating film 6 are set as follows. For example, a RF power is set to be 1.6 kW. A sputtering atmosphere is set to be 9.5 mTorr. A temperature to form the film is set to be 200 degrees Celsius. Next, the ferroelectric capacitor 7 is formed on the insulating film 6. The ferroelectric capacitor 7 is comprised of an upper electrode 7a, a lower electrode 7b, and a capacitive insulating film 7c. The ferroelectric capacitor 7 is formed though the following processes. First, Pt of 150 nm in thickness is formed with a sputtering method. This Pt film functions as the lower electrode 7b. For example, Pt is used as a sputtering target and Ar is used as a sputtering gas to form the Pt film. The conditions for forming the Pt film are set as follows. For example, a RF power is set to be 1 kW. A sputtering atmosphere is set to be 10 mTorr. A temperature of forming the film is set to be 200 degrees Celsius. Next, a ferroelectric of 120 nm in thickness is formed. This ferroelectric becomes the capacitive insulating film 7c. For example, the capacitive insulating film 7c is comprised of SBT. The SBT film is formed through the following processes. For example, precursor solution that SBT dissolves is spin-coated, and the solution is volatilized by 5 minutes drying on a hot plate of 150-200 degrees Celsius. Then, SBT can be crystallized by conducting a heat treatment in oxygen atmosphere at 800 degrees Celsius for 30 minutes in s furnace. Next, a Pt film of 200 nm in thickness is formed with a sputtering method. This Pt film becomes the upper electrode 7a. For example, Pt is used as a sputtering target, and Ar is used as a sputtering gas to form the Pt film. The conditions for forming the Pt film are set as follows. For example, a RF power is set to be 1 kW. A pressure of a sputtering atmosphere is set to be 10 mTorr. A temperature of forming the film is set to be 200 degrees Celsius. Thus, a laminated film, which comprises a Pt film (i.e., the lower electrode 7b), a SBT film (i.e., the capacitive insulating film 7c), and a Pt film (i.e., the upper electrode 7a), is formed. Next, patterning is sequentially conducted for the Pt film (the lower electrode 7b), the SBT film (the capacitive insulating film 7c), and the Pt film (the upper electrode 7a) with photolithography and etching. For example, $Cl_2$ and Ar are used as an etching gas of the upper electrode 7a comprised of Pt. The conditions for etching the upper electrode 7a are set as follows. For example, gas flow rates of $Cl_2$ and Ar are set to be 10 and 10 sccm, respectively. A RF power is set to be 120-500 W. The chamber pressure is set to be 5 mTorr. Also, $Cl_2$, Ar, hydrogen bromide (HBr), and $O_2$ are used as an etching gas of the capacitive insulating film 7c comprised of SBT, for instance. The conditions for etching the capacitive insulating film 7c are set as follows. For example, gas flow rates of $Cl_2$, Ar, HBr, and $O_2$ are set to be 5, 12, 3, 3 sccm, respectively. The RF power is set to be 100-800 W. The chamber pressure is set to be 2 mTorr. Also, $Cl_2$ and Ar are used as an etching gas of the lower electrode 7b comprised of Pt, for instance. The conditions for etching the lower electrode 7b are set as follows. For example, gas flow rates of $Cl_2$ and Ar are set to be 10 and 10 sccm. The RF power is set to be 120-500 W. The chamber pressure is set to be 5 mTorr. Thus, as shown in FIG. 3A, the ferroelectric capacitor 7, which comprises the upper electrode 7a, the lower electrode 7b, and the capacitive insulating film 7c, is formed. After the ferroelectric capacitor 7 is formed, a heat treatment in an oxygen atmosphere at 600-750 degrees Celsius is conducted for one hour in order to recover the ferroelectric properties of the capacitive insulating film 7c. Next, an insulating film 8 comprised of a silicon dioxide film is formed with the CVD method, so that it covers the insulating film 6 and the ferroelectric capacitor 7.

Figure 3B:
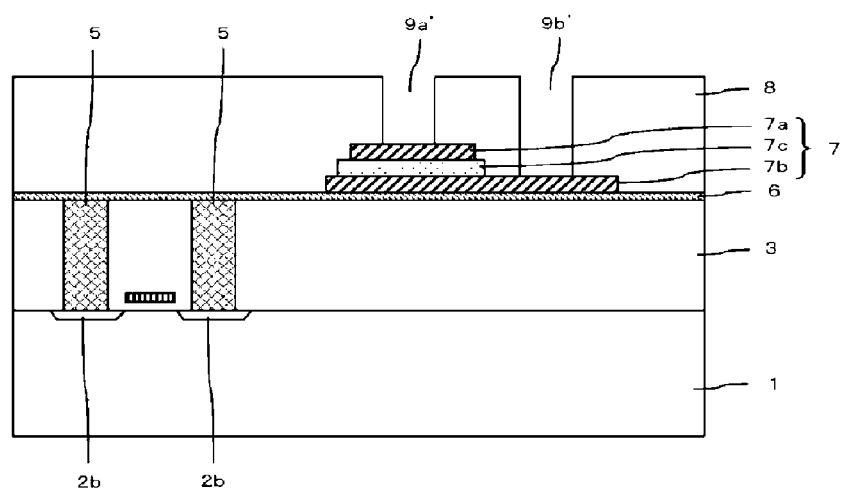

Next, as shown in FIG. 3B, a contact hole 9a' and a contact hole 9b' are formed with photolithography and etching. The contact hole 9a' exposes a portion of the upper electrode 7a of the ferroelectric capacitor 7. Also, the contact hole 9b' exposes a portion of the lower electrode 7b of the ferroelectric capacitor 7. For example, $CHF_3$, $CF_4$, and Ar are used as the etching gas for etching the contact holes 9a' and 9b'. The conditions for etching the contact holes 9a' and 9b' are set as follows. For example, gas flow rates of $CHF_3$, $CF_4$, and Ar are set to be 80, 15, 400 sccm, respectively. The RF power is set to be 800 W. The chamber pressure is set to be 500 mTorr. After the contact holes 9a' and 9b' are formed, a heat treatment in an oxygen atmosphere at 600-750 degrees Celsius for an hour is conducted to recover the ferroelectric properties of the capacitive insulating film 7c.

Figure 3C:
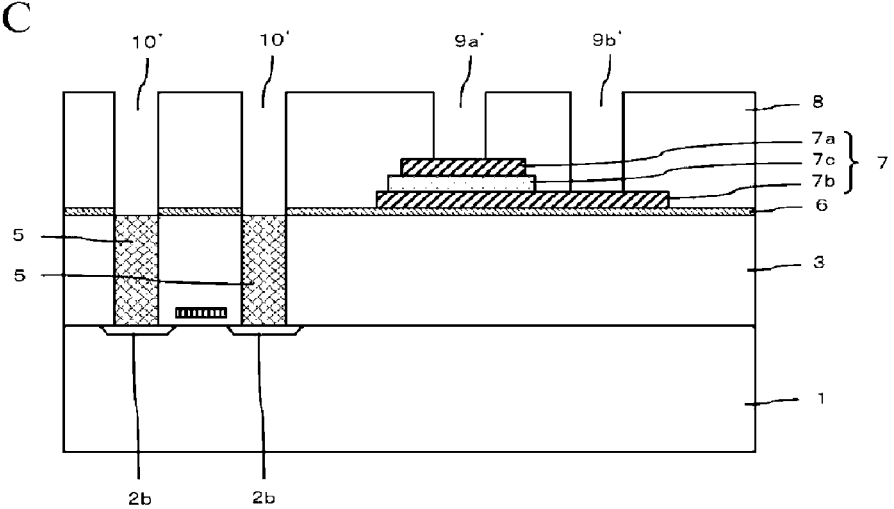

Next, as shown in FIG. 3C, a contact hole 10' is formed with photolithography and etching, so that it exposes an upper side of the plug 5. For example, $CHF_3$, $CF_4$, and Ar are used as an etching gas. The conditions for the etching are set as follows. For example, gas flow rates of $CHF_3$, $CF_4$, and Ar are set to be 80, 15, and 400 sccm, respectively. The RF power is set to be 800 W. The chamber pressure is set to be 500 mTorr.

Figure 4A:
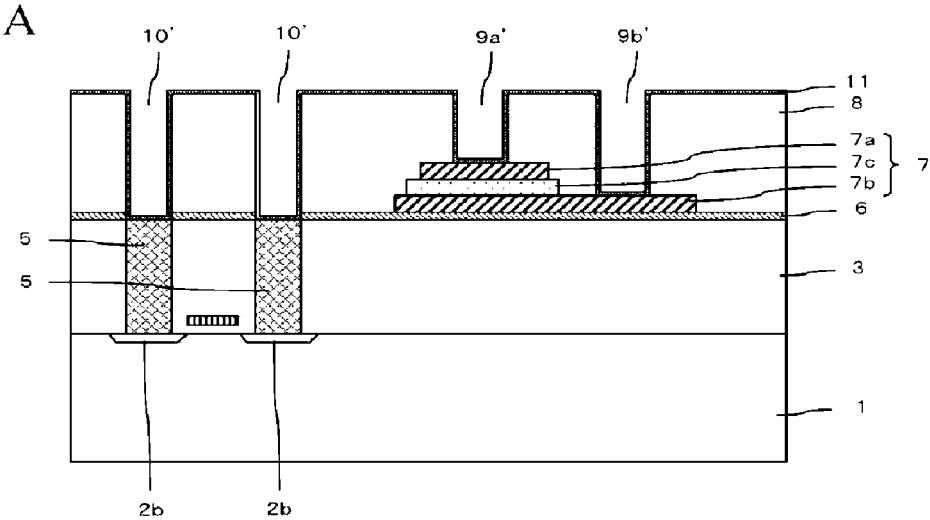
FIGS. 4A to 4C are diagrams showing steps of forming a semiconductor device in accordance with the first embodiment of the present invention.

Next, as shown in FIG. 4A, a barrier film 11 is formed with a sputtering method, so that it covers the insulating film 8, and inside the contact holes 9a', 9b', and 10'. The barrier film 11 is a conducting film which inhibits chemical reactions between the upper electrode 7a and the wiring film 12 that is described below. TaN with an amorphous structure is used as the barrier film 11, and a TaN film of 100 nm in thickness is formed. For example, Ta is used as a sputtering target, and a mixed gas of Ar and $N_2$ is used as a sputtering gas to form the TaN film. The conditions for forming the TaN film are set as follows. For example, gas flow rates of Ar and $N_2$ are set to be 72 and 28 sccm, respectively. The DC power is set to be 700 W. The sputtering atmosphere pressure is set to be 3.5 mTorr. The temperature for forming the film is set to be 150 degrees Celsius. Also, as described above in the explanation of the ferroelectric capacitor and the wiring structure (FIG. 1), the resistance value of TaN is increased if TaN is amorphized. Therefore, the resistance value of the barrier film 11 may be reduced by reducing the thickness of TaN and then laminating a metal nitride film such as TiN, ZrN, and WN on TaN.

Figure 5:
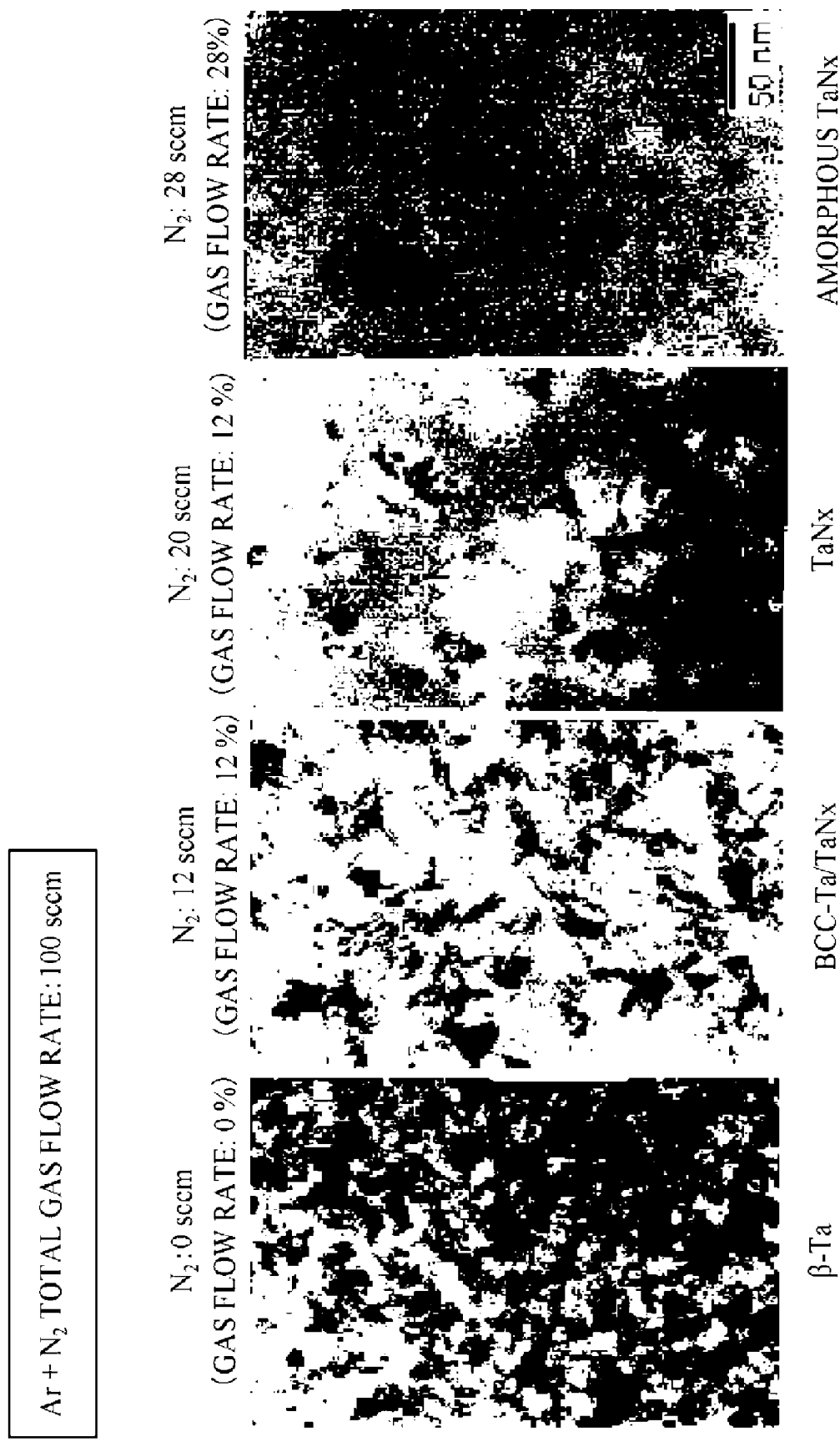
FIG. 5 is a diagram showing $N_2$ gas flow rate dependence of TaN crystal.

The relationship between the gas flow rate of $N_2$ (i.e., the gas flow rate of $N_2$ to Ar) and the crystal structure of TaN in forming a TaN film will be explained here. FIG. 5 shows a plane transmission electron microscope (TEM) image of a Ta crystal or a TaN crystal when the gas flow rate of $N_2$ in a mixed gas of $N_2$ and Ar is set as a parameter. Also, the total flow of a mixed gas of $N_2$ and Ar is set to be 100 sccm. If the gas flow rate of $N_2$ is 0% (i.e., 0 sccm), in other words, if the TaN film is formed only with an Ar gas, a beta phase Ta crystal is formed. The existence of the crystal grain can be seen in the TEM image. If the gas flow rate of $N_2$ is increased, the Ta crystal structure gradually changes into a $TaN_x$ crystal structure. However, if the gas flow rate of $N_2$ is 12% (i.e., 12 sccm), the nitriding of the deposition film will not be sufficiently complete and the deposition film will be in a state in which body centered cubic (BCC) Ta remains in the $TaN_x$.

If the gas flow rate of $N_2$ is increased to 20% (i.e., 20 sccm), only $TaN_x$ will be formed, and furthermore not only a crystal phase but also an amorphous phase will exist at the same time. Also, if a gas flow rate of $N_2$ is increased to 28% (i.e., 28 sccm), TaNx becomes nearly amorphous. Thus, the crystallinity of TaN can be controlled by changing the gas flow rate of $N_2$. If TaN with an amorphous structure is used as a barrier film, it is possible to effectively inhibit chemical reactions between Pt, which is a material of the upper electrode 7a or a lower electrode 7b, and Al, which is the main material of the wiring film 12.

Figure 4B:
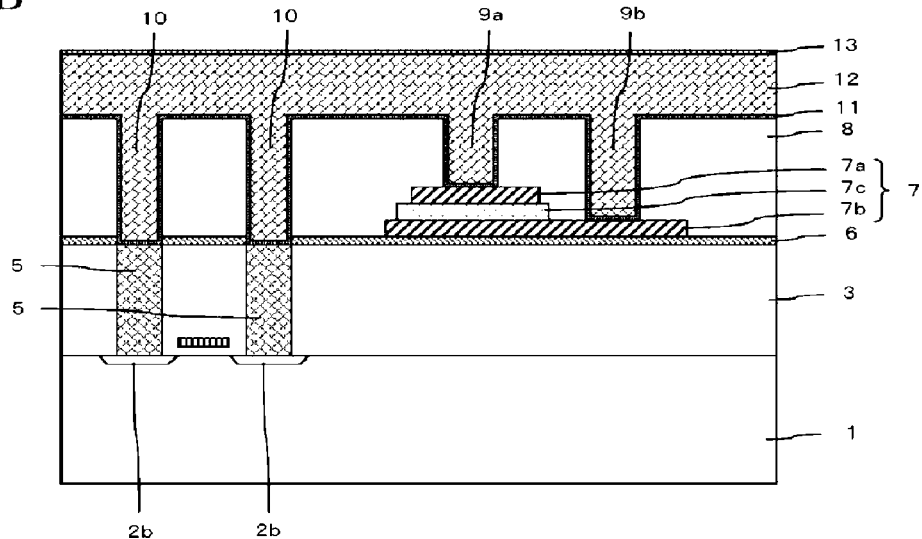

Next, as shown in FIG. 4B, a wiring film 12 and a conducting film 13 are sequentially formed on the barrier film 11 with a sputtering method. Al alloy is used for the wiring film 12. The Al alloy film is formed in two steps. In the first step of forming the Al alloy film, Al alloy is used as a sputtering target and Ar is used as a sputtering gas, for instance. The conditions for forming the Al alloy film are set as follows. For example, the DC power is set to be 9 kW. The sputtering atmosphere pressure is set to be 3 mTorr. The temperature of forming the film is set to be 400 degrees Celsius. In the second step of forming the Al alloy film, Al alloy is used as a sputtering target and Ar is used as a sputtering gas, for instance. The conditions for forming the Al alloy film are set as follows. For example, the DC power is set to be 2 kW. The sputtering atmosphere pressure is set to be 3 mTorr. The temperature of forming the film is set to be 400 degrees Celsius. Also, instead of using Al alloy, Al, Cu, or an alloy whose main constituent is Cu, can be used as a material of the wiring film 12. The conducting film 13 is an antireflection film with respect to the Al alloy wiring film 12. The conducting film 13 is comprised of TiN. For example, Ti is used as a sputtering target and $N_2$ is used as a sputtering gas to form a TiN film. The conditions for forming the TiN film are set as follows. For example, the DC power is set to be 5 kW. The sputtering atmosphere pressure is set to be 7 mTorr. The temperature of forming the film is set to be 100 degrees Celsius. In this phase, Al alloy is implanted into the contact holes 9a', 9b' and 10', and contacts 9a, 9b, and 10 integral with the wiring film 12 are formed.

Figure 4C:
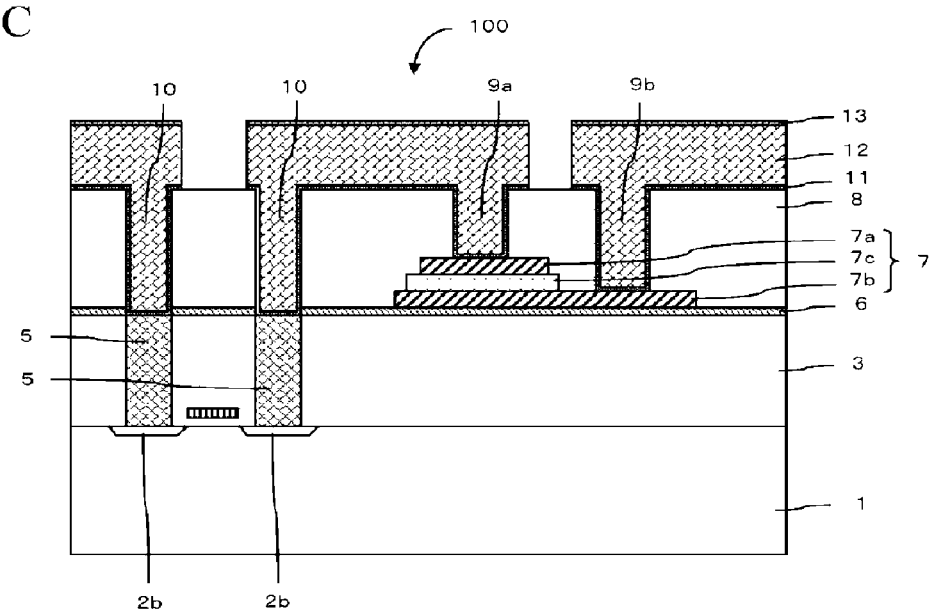

Next, as shown in FIG. 4C, patterning is conducted for the barrier film 11, the wiring film 12, and the conducting film 13 with photolithography and etching. For example, boron chloride ($BCl_3$) and $Cl_2$ are used as an etching gas. The conditions for the etching are set as follows. For example, gas flow rates of $BCl_3$ and $Cl_2$ are set to be 40 and 60 sccm, respectively. The RF power is set to be 70 W. The chamber pressure is set to be 1 Pa.

Subsequently, a ferroelectric memory cell 100 is formed by repeating steps of forming an interlayer insulating film, an upper layer wiring, and so on. However, these steps are not directly related with the present invention. Therefore, explanation of these steps is omitted here.

Barrier Properties Assessment Test

Based on experimental data, the barrier effect of TaN is explained here from the perspective of contact resistance.

Figure 6:
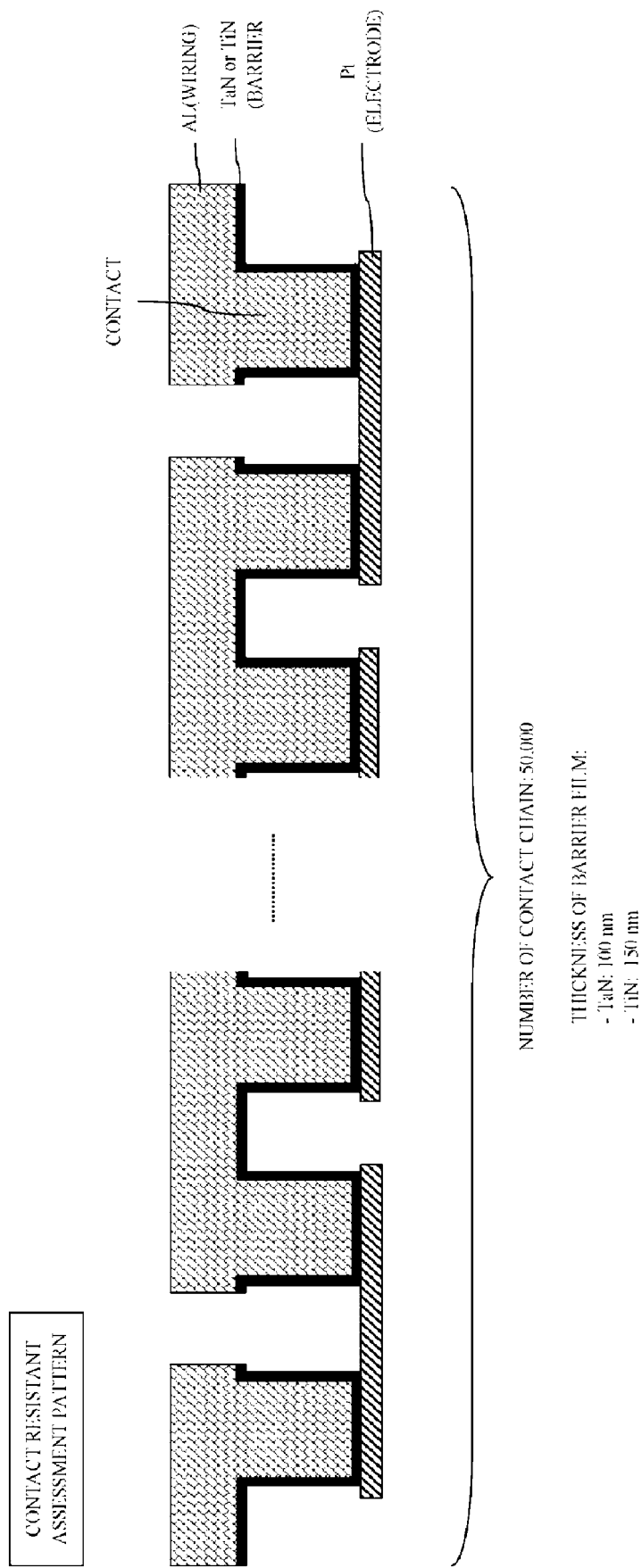
FIG. 6 is a diagram showing a structure of contact resistant assessment pattern.

A resistance assessment pattern with a contact chain structure of Pt electrodes and Al wirings is used in this experiment, which models the wiring structure of the capacitors shown in FIG. 6. The resistance assessment pattern shown in FIG. 6 employs a structure in which plural Pt electrodes and Al electrodes are serially connected through 50,000 contacts. Also, a barrier film comprised of TiN of 150 nm in thickness or a barrier film comprised of TaN of 100 nm in thickness is formed between a Pt electrode and an Al wiring. Also, the TaN barrier film is comprised of TaN with an amorphous structure, and it is formed with the gas flow rate of $N_2$ set to be 28%. For example, the resistance assessment pattern shown in FIG. 6 is formed as a test element group (TEG) pattern that is mounted with an individual chip of integrated circuits mounted on a wafer product.

Figure 7:
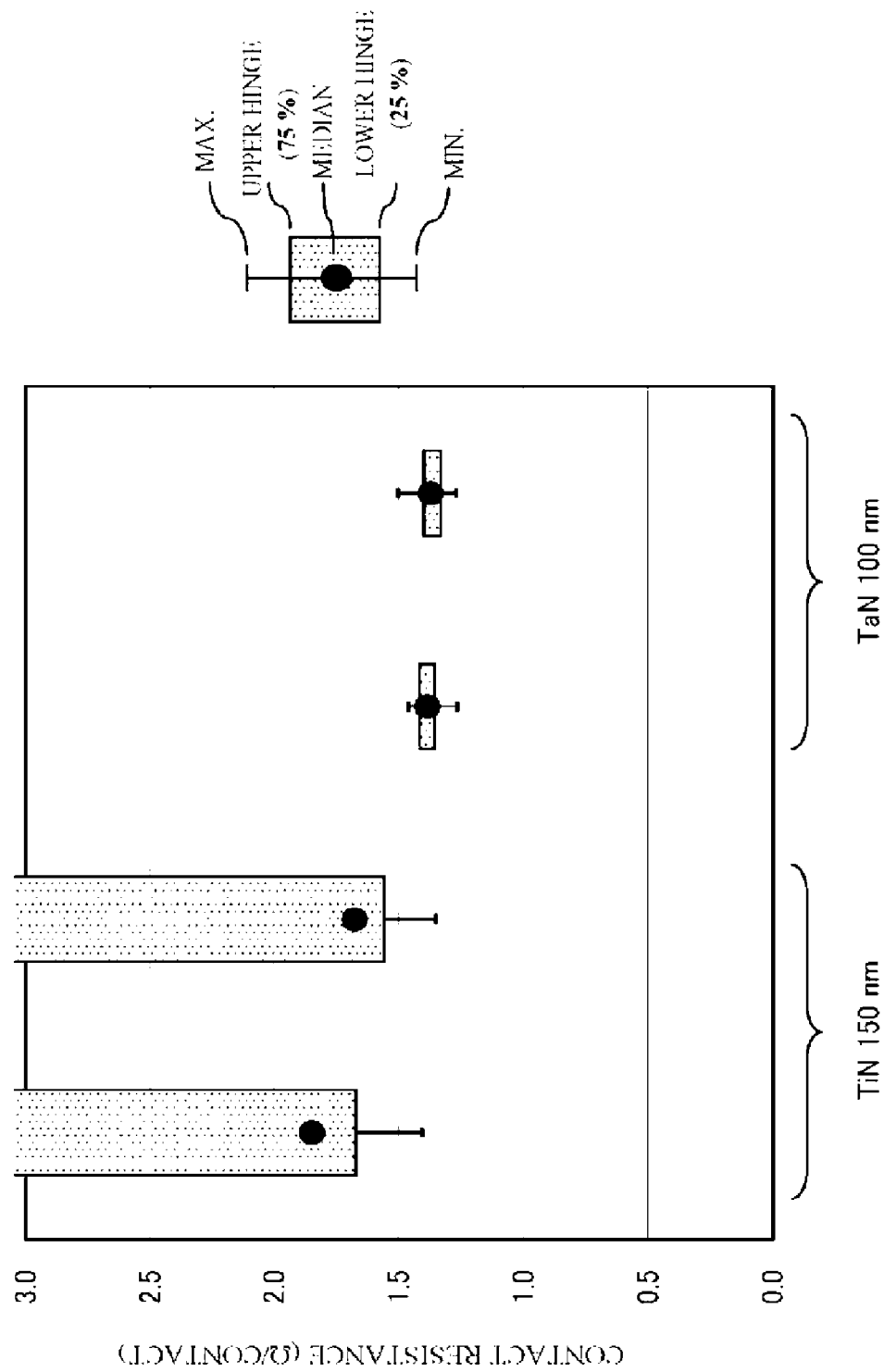
FIG. 7 is a diagram showing barrier material dependence of contact resistance.

FIG. 7 shows contact resistance of each contact chain after a heat treatment in an oxygen atmosphere at 400 degrees Celsius for 30 minutes is conducted toward a resistant assessment pattern with a contact chain structure including the above described TiN barrier film or TaN barrier film. Contact resistance of each contact chain is calculated by measuring resistance of the whole resistance assessment pattern shown in FIG. 6 and then dividing the resistance by the sum of contact chains (i.e., 50,000). Also, data shown in FIG. 7 shows the median, maximum, and minimum of contact resistance when the barrier film is TiN and when the barrier film is TaN. These values are measured with a resistance assessment pattern corresponding to 2 wafers, in other words, a resistance assessment pattern corresponding to 96 chips (i.e., 48 chips per wafer). Also, FIG. 7 simultaneously indicates a lower hinge value in which 25% of the measured data is included, and a upper hinge value in which 75% of the measured data is included. The following is revealed from the data shown in FIG. 7. If TaN is used for a barrier film, even if thickness of the TaN barrier film is 50 nm thinner than that of a TiN barrier film, contact resistance of the TaN barrier film can be lower than that of the TiN barrier film. Also, if TaN is used for a barrier film, variation of resistance in a wafer side, in other words, the difference between the upper hinge value and the lower hinge value, will be small.

Figure 8A:
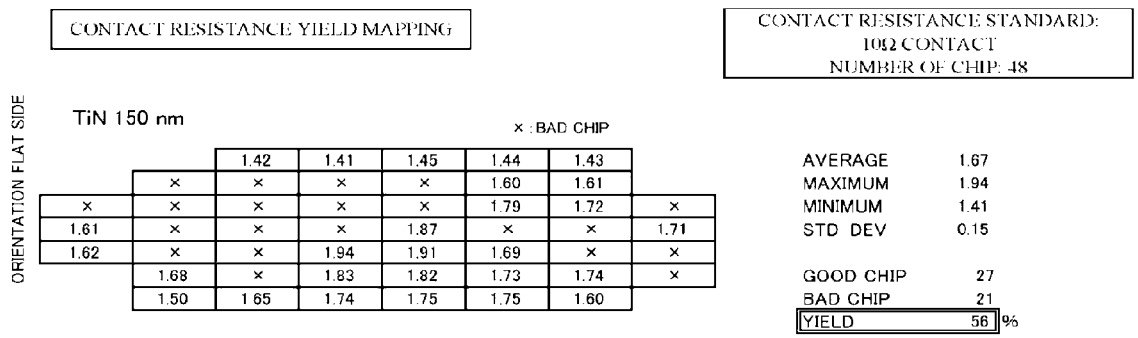
FIG. 8A and 8B are diagrams showing yield mapping of contact resistance.
Figure 8B:
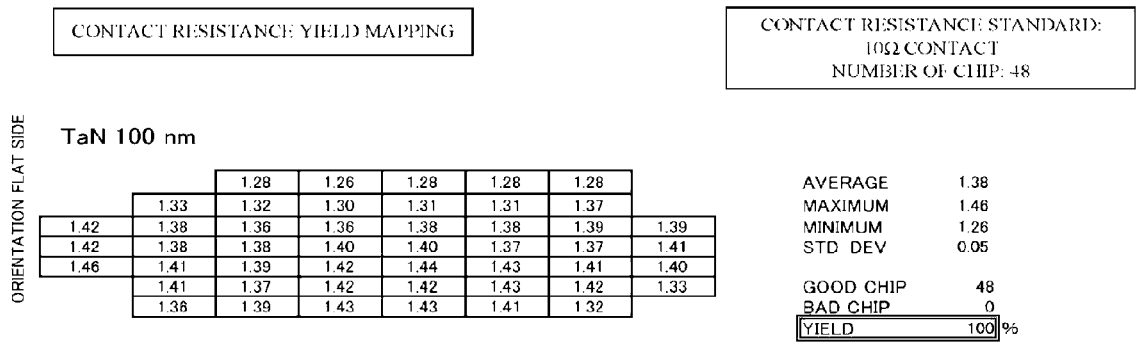

FIGS. 8A and 8B show the contact resistance yield mapping in a wafer of each contact chain after a heat treatment in an oxygen atmosphere at 400 degrees Celsius for 30 minutes is conducted for a resistance assessment pattern with a contact chain structure including the above described TiN barrier film or TaN barrier film. When an upper standard value of contact resistance is set to be 10 Ω/contact chain, only 56% yield can be obtained if TiN is used as a barrier film. Also, the value of standard deviation for 27 good chips is 0.15, and this indicates a large variation in resistance in a wafer side. Also, when bad portions of a resistance assessment pattern in bad chips shown in FIG. 8A with a mark "x" was observed, destruction of a wiring pattern by chemical reactions between Al and Pt was found. On the other hand, when TaN was used for a barrier film, 100% yield was obtained. Also, at this time, the value of standard deviation is 0.05, and this indicates a small variation in resistance.

From the results of the above mentioned experiment, it is demonstrated that chemical reactions between Al and Pt could be effectively inhibited by using TaN with an amorphous structure as a barrier film.

According to the semiconductor device in accordance with the first embodiment of the present invention, a barrier film 11 comprised of TaN with an amorphous structure is formed between the upper electrode 7a (or the lower electrode 7b) comprised of Pt and the wiring film 12 mainly comprised of Al. Thus, the barrier properties with respect to the diffusion of Al are improved without forming a crystal grain boundary through which Al in a barrier film easily diffuses, and chemical reactions between Al and Pt can be effectively inhibited. Furthermore, the barrier film 11 is formed as a portion of a wiring structure. Therefore, surface unevenness is not encouraged and the thickness of the whole structure is not increased by forming the barrier film 11.

Second Embodiment

Capacitor Structure and Wiring Structure

Figure 9:
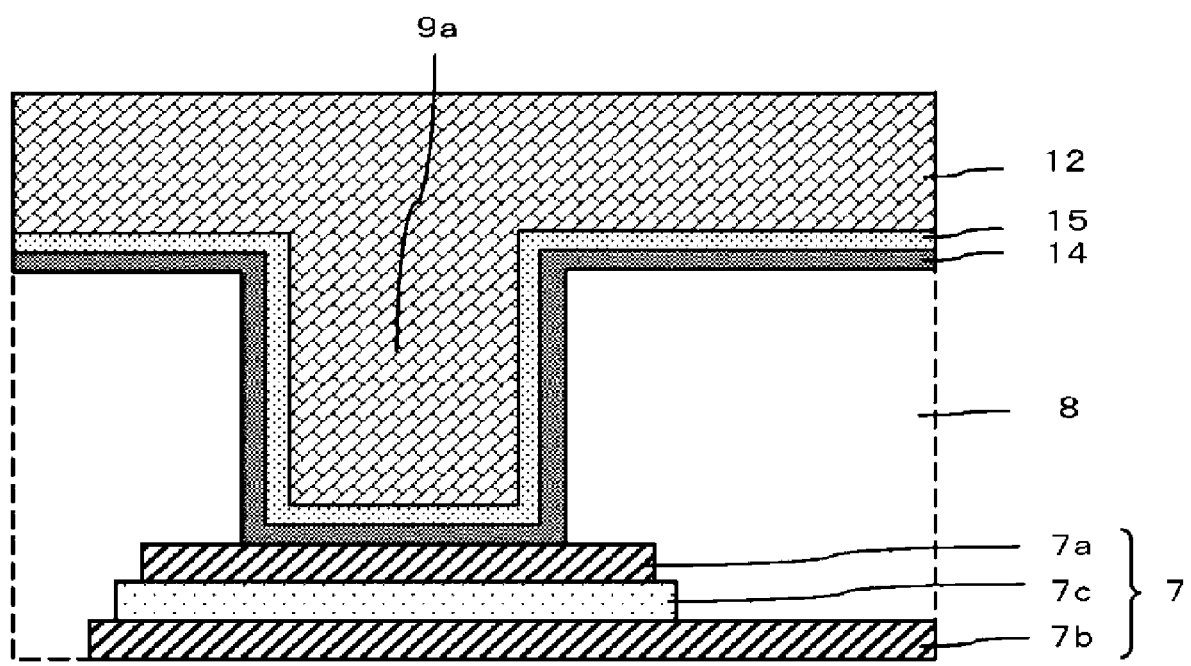
FIG. 9 is a schematic diagram showing the structure of a ferroelectric capacitor and its wiring structure used in a semiconductor device in accordance with a second embodiment of the present invention.

FIG. 9 is a schematic diagram showing a ferroelectric capacitor and its wiring structure in a semiconductor device in accordance with a second embodiment of the present invention. The ferroelectric capacitor and its wring structure in FIG. 9 include some elements that are also shown in FIG. 1. Therefore, each of these elements in FIG. 9 has the same number and/or symbol that are assigned to the corresponding elements in FIG. 1, and the description thereof will be partially omitted here.

A contact 9a is a connector for electrically connecting the ferroelectric capacitor 7 and external elements. The contact 9a is formed so as to be in contact with the upper electrode 7a through a barrier film 14 and a reaction film 15 as a portion of a wiring film 12 formed on an insulating film 8. The barrier film 14 is a conducting film with an amorphous structure which inhibits chemical reactions between the upper electrode 7a and the wiring film 12. It is required to be formed so as to be located between the upper electrode 7a and the wiring film 12 at the bottom of the contact 9a. The barrier film 14 is comprised of TaN with an amorphous structure. A reaction film 15 is a conducting film that forms an alloy layer by chemically reacting with a wiring film 12. As with the barrier film 14, the reaction film 15 is required to be formed so as to be located between the upper electrode 7a and the wiring film 12 at the bottom of the contact 9a. The reaction film 15 is comprised of Ti. The Ti of the reaction film 15 chemically reacts with Al at the temperature of a heat treatment during the manufacturing process, such as the temperature at which an Al alloy film which is the main material of the wring film 12 is formed. Through the chemical reaction, an alloy layer such as $Al_3Ti$ is formed. At this time, diffusion time of Al is delayed because a portion of the Al is used for the chemical reaction with Ti. Also, the diffusion distance of Al is effectively lengthened because an alloy layer of Al and Ti is formed. It is also possible to use magnesium (Mg), manganese (Mn), nickel (Ni), hafnium (Hf), lithium (Li), scandium (Sc), zirconium (Zr), silicon (Si), lead (Pb), niobium (Nb), zinc (Zn), strontium (Sr), indium (In), and silver (Ag), instead of using Ti as the reaction film 15.

Thus, in the ferroelectric capacitor and its wiring structure in accordance with the second embodiment of the present invention, the barrier film 14 comprised of TaN with an amorphous structure and the reaction film 15 comprised of Ti that chemically reacts with the wiring film 12 are formed between the upper electrode 7a comprised of Pt and the wiring film 12 mainly comprised of Al. Because of the existence of the TaN barrier film 14, diffusion of Al is inhibited without forming a crystal grain boundary that Al in the barrier film can easily diffuse. Furthermore, the diffusion time of Al is delayed by chemically reacting the reaction film 15 comprised of Ti with Al, and the diffusion distance of Al is effectively lengthened. These synergistic effects effectively inhibit Al from reaching the surface of the Pt electrode.

Manufacturing Method

A manufacturing method of the ferroelectric capacitor and its wiring structure shown in FIG. 9, that is, a manufacturing method of a ferroelectric memory cell 200, includes the successive processes from a process of forming a MOS transistor 2 to a process of forming a contact hole 10' exposing an upper side of a plug 5. These processes are also included in the manufacturing method of the ferroelectric capacitor memory cell 100 of the first embodiment of the present invention as shown in FIGS. 2A to 3C. Therefore, explanation of these processes is omitted here. In the second embodiment of the present invention, the ferroelectric memory cell 200 is formed by conducting the processes shown in FIGS. 10A to 10C after the process of forming a contact hole 10' shown in FIG. 3C is completed.

Figure 10A:
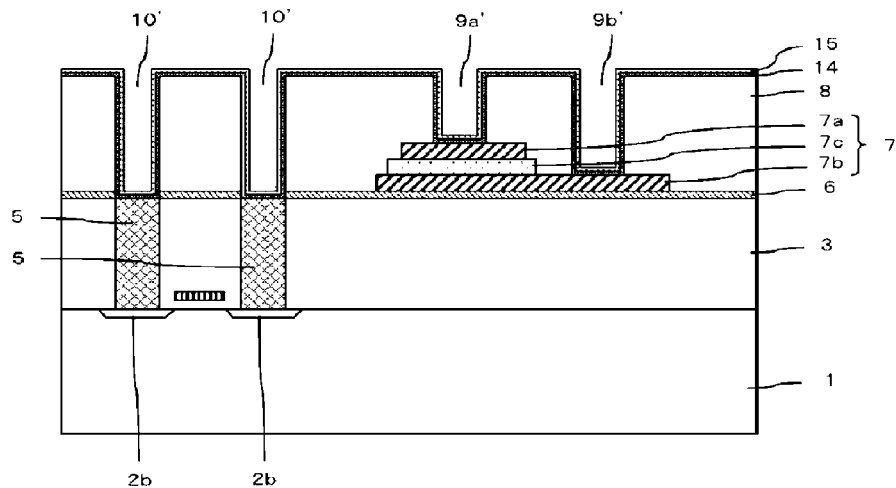
FIGS. 10A to 10C are diagrams showing steps of forming a semiconductor device in accordance with the second embodiment of the present invention.

After the contact hole 10' exposing an upper side of the plug 5 is formed as shown in FIG. 3C, a barrier film 14 is formed with a sputtering method as shown in FIG. 10A so as to cover the upper side of an insulating film 8, and the interiors of the contact holes 9a', 9b', and 10'. The barrier film 14 is a conducting film which inhibits chemical reactions between the upper electrode 7a and the wiring film 12 that is described below. TaN with an amorphous structure is used as the barrier film 14, and a TaN film of 100 nm in thickness is formed. For example, Ta is used as a sputtering target, and a mixed gas of Ar and $N_2$ is used as a sputtering gas to form the TaN film. The conditions for forming the TaN film are set as follows. For example, the gas flow rates of Ar and $N_2$ are set to be 72 and 28 sccm, respectively. The DC power is set to be 700 W. The sputtering atmosphere pressure is set to be 3.5 mTorr. The temperature of forming the film is set to be 150 degrees Celsius. Next, a reaction film 15 is formed on the barrier film 14. The reaction film 15 is a conducting film that chemically reacts with the wiring film that is described below. For example, Ti is used as the reaction film 15. The thickness of Ti at the bottom of contact holes 9a' and 9b' is set to be a few nm to 50 nm. For example, Ti is used as a sputtering target and Ar is used as a sputtering gas to form a Ti film. The conditions for forming the Ti film are set as follows. For example, the DC power is set to be 3 kW. The stage temperature is set to be 150 degrees Celsius. It is also possible to use Mg, Mn, Ni, Hf, Li, Sc, Zr, Si, Pb, Nb, Zn, Sr, In, and Ag, instead of using Ti as the reaction film 15.

Figure 10B:
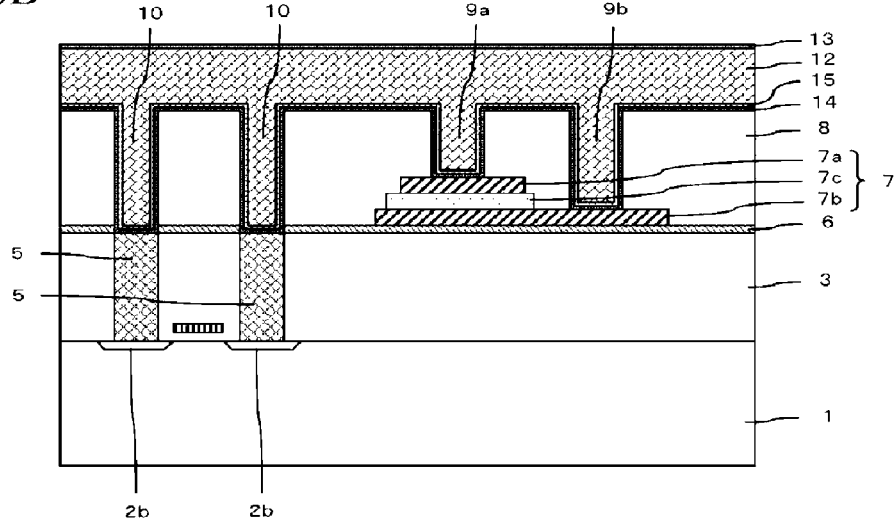

Next, as shown in FIG. 10B, a wiring film 12 and a conducting film 13 are sequentially formed on the reaction film 15 with a sputtering method. Al alloy is used for the wiring film 12. Not only the barrier film 14 with an amorphous structure but also the reaction film 15 that chemically reacts with an Al alloy is formed under the Al alloy film. Therefore, the barrier properties with respect to diffusion of Al are further improved, compared to the first embodiment of the present invention. Because of this, the temperature at which an Al alloy film is formed can be set to be a higher temperature, the wiring film 12 can be implanted into contact holes 9a', 9b', and 10' sufficiently, and flatness of the wiring film 12 can be improved. The Al alloy film is formed in two steps. In the first step of forming the Al alloy film, Al alloy is used as a sputtering target and Ar is used as a sputtering gas, for instance. The conditions for forming the Al alloy film are set as follows. For example, the DC power is set to be 9 kW. The sputtering atmosphere pressure is set to be 3 mTorr. The temperature at which the film is formed is set to be 500 degrees Celsius. In the second step of forming the Al alloy film, Al alloy is used as a sputtering target and Ar is used as a sputtering gas, for instance. The conditions for forming the Al alloy film are set as follows. For example, the DC power is set to be 2 kW. The sputtering atmosphere pressure is set to be 3 mTorr. The temperature for forming the film is set to be 500 degrees Celsius. Also, instead of using Al alloy, Al, Cu, or an alloy whose main constituent is Cu, can be used as the material of the wiring film 12. The conducting film 13 is an antireflection film with respect to the Al alloy wiring film 12. The conducting film 13 is comprised of TiN. For example, Ti is used as a sputtering target and $N_2$ is used as a sputtering gas to form a TiN film. The conditions for forming the TiN film for set as follows. For example, the DC power is set to be 5 kW. The sputtering atmosphere pressure is set to be 7 mTorr. The temperature for forming the film is set to be 100 degrees Celsius. In this phase, Al alloy is implanted into the contact holes 9a', 9b' and 10', and contacts 9a, 9b, and 10 integral with the wiring film 12 are formed.

Figure 10C:
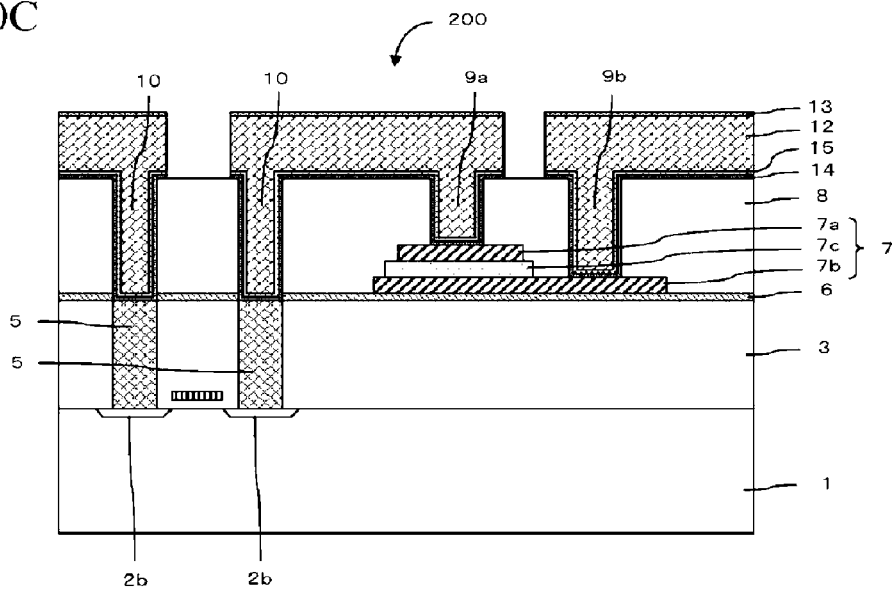

Next, as shown in FIG. 10C, patterning is conducted for the barrier film 14, the reaction film 15, the wiring film 12, and the conducting film 13 with photolithography and etching. For example, $BCl_3$ and $Cl_2$ are used as an etching gas. The conditions for the etching are set as follows. For example, the gas flow rates of $BCl_3$ and $Cl_2$ are set to be 40 and 60 sccm, respectively. The RF power is set to be 70 W. The chamber pressure is set to be 1 Pa.

Subsequently, a ferroelectric memory cell 200 is formed by repeating the steps of forming an interlayer insulating film, an upper layer wiring, and so on. However, these steps are not directly related with the present invention. Therefore, explanation of these steps is omitted here.

According to the semiconductor device in accordance with the second embodiment of the present invention, the barrier film 14 comprised of TaN with an amorphous structure and the reaction film 15 that is comprised of Ti and chemically reacts with the wiring film 12 are formed between the upper electrode 7a (or the lower electrode 7b) comprised of Pt and the wiring film 12 mainly comprised of Al.

Because of the existence of the TaN barrier film 14, diffusion of Al is inhibited without forming a crystal grain boundary through which Al in a barrier film easily diffuses. Also, the diffusion time of Al is delayed and diffusion distance of Al is effectively lengthened by chemically reacting Ti that is a material of the reaction film 15 and Al that is the main material of the wiring film 12. These synergy effects can further effectively inhibit the chemical reactions between Al and Pt, compared to the semiconductor device of the first embodiment, which includes only the barrier film 14 comprised of TaN with an amorphous structure and not the reaction film 15. Also, according to the semiconductor device in accordance with the second embodiment of the present invention, the temperature of the wiring film 12 can be set to be a higher temperature. Therefore, the wiring film 12 can be implanted into contact holes 9a', 9b', and 10' sufficiently, and flatness of the wiring film 12 can be improved. Thus, a capacitor structure with favorable electrical properties can be formed. Furthermore, the barrier film 14 and the reaction film 15 are formed as a portion of a wiring structure. Therefore, surface unevenness is not encouraged and the thickness of the whole structure is not increased by forming the barrier film 14 and the reaction film 15.

Third Embodiment

Capacitor Structure and Wiring Structure

Figure 11:
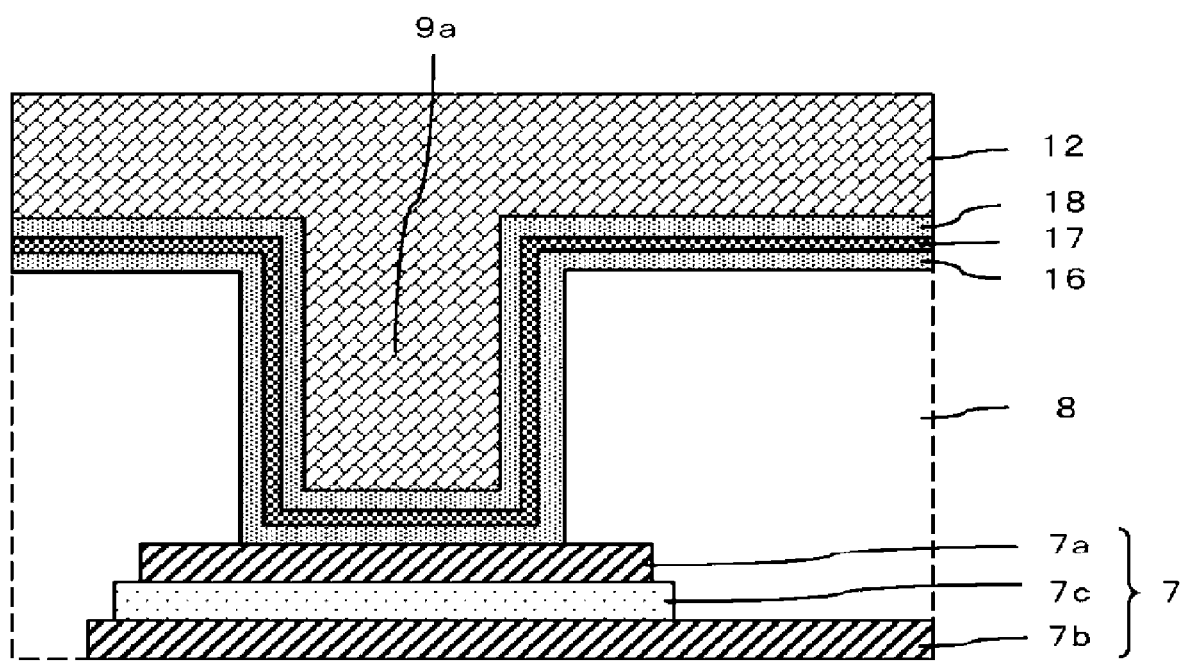
FIG. 11 is a schematic diagram showing the structure of a ferroelectric capacitor and its wiring structure used in a semiconductor device in accordance with a third embodiment of the present invention.

FIG. 11 is a schematic diagram showing a ferroelectric capacitor and its wiring structure in a semiconductor device in accordance with a third embodiment of the present invention.

The ferroelectric capacitor and its wring structure in FIG. 11 include some elements that are also shown in FIG. 1. Therefore, each of these elements in FIG. 11 has the same number and/or symbol that are assigned to the corresponding elements in FIG. 1, and the description thereof will be partially omitted here.

A contact 9a is a connector for electrically connecting the ferroelectric capacitor 7 and external elements. The contact 9a is formed so as to be in contact with the upper electrode 7a through barrier films 16, 17, and 18 as a portion of a wiring film 12 formed on an insulating film 8. The barrier films 16, 17, and 17 are conducting films which inhibit chemical reactions between the upper electrode 7a and the wiring film 12. They are required to be formed so as to be located between the upper electrode 7a and the wiring film 12 at the bottom of the contact 9a. The barrier films 16 and 18 are comprised of TiN. The barrier film 17 is either a laminated film of titanium dioxide ($TiO_2$) and titanium nitride oxide ($Ti_xO_yN_z$) or a single layer film of $Ti_xO_yN_z$. It is formed by oxidizing a barrier film 16 comprised of TiN. The barrier film 17, which is either a laminated film of $TiO_2$ and $Ti_xO_yN_z$ or a single layer film of $Ti_xO_yN_z$, has an effect that makes the crystal grain boundaries of the barrier films 16 and 18 comprised of TiN discontinuous. Also, the barrier film 17 itself has the effect of inhibiting diffusion of Al.

Figure 12A:
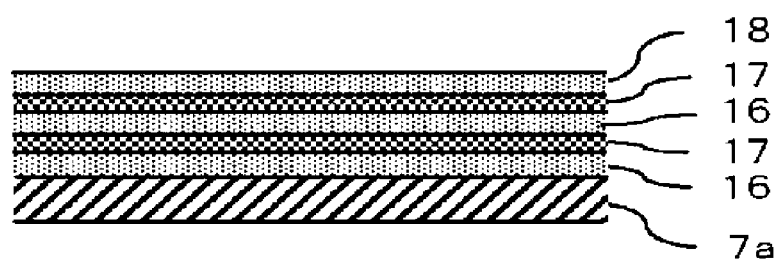
FIGS. 12A and 12B are diagrams showing other structures of a barrier film in accordance with the third embodiment of the present invention.
Figure 12B:
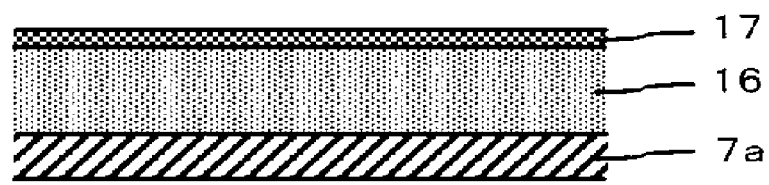

The structure of the barrier film in accordance with the third embodiment of the present invention is not limited to a three-layer structure comprised of the barrier film 16 (i.e., TiN), the barrier film 17 (i.e., a laminated film of $Ti_xO_yN_z$ and $TiO_2$ or a single layer film of $Ti_xO_yN_z$), and the barrier film 18 (i.e., TiN) as shown in FIG. 11. For example, as shown in FIG. 12A, it can be a structure in which plural barrier films 17 (i.e., a laminated film of $Ti_xO_yN_z$ and $TiO_2$ or a single layer film of $Ti_xO_yN_z$) are formed between a barrier film 16 (i.e., TiN) of the bottom layer and a barrier film 18 (i.e., TiN) of the top layer. Also, as shown in FIG. 12B, it can be a structure in which a barrier film 17 (i.e., a laminated film of $Ti_xO_yN_z$ and $TiO_2$ or a single layer film of $Ti_xO_yN_z$) is formed on a thickly formed barrier film 16.

Thus, in the ferroelectric capacitor and its wiring structure in accordance with the third embodiment of the present invention, the barrier film comprised of TiN, such as the barrier films 16 and 18, and the barrier film 17 which is a laminated film of $TiO_2$ and $Ti_xO_yN_z$ or a single layer film of $Ti_xO_yN_z$, are formed between the upper electrode 7a comprised of Pt and the wiring film 12 mainly comprised of Al. Therefore, this makes the crystal grain boundary of the barrier films that Al easily diffuses discontinuous, and effectively inhibits Al from reaching the surface of a Pt electrode.

Manufacturing Method

The manufacturing method of the ferroelectric capacitor and its wiring structure shown in FIG. 11, that is, the manufacturing method of a ferroelectric memory cell 300, includes the successive processes from a process of forming a MOS transistor 2 to a process of forming a contact hole 10' exposing an upper side of a plug 5. These processes are also included in the manufacturing method of the ferroelectric capacitor memory cell 100 of the first embodiment of the present invention as shown in FIGS. 2A to 3C. Therefore, explanation of these processes is omitted here. In the third embodiment of the present invention, the ferroelectric memory cell 300 is formed by conducting processes shown in FIGS. 13A to 13C after the process of forming a contact hole 10' shown in FIG. 3C is completed.

Figure 13A:
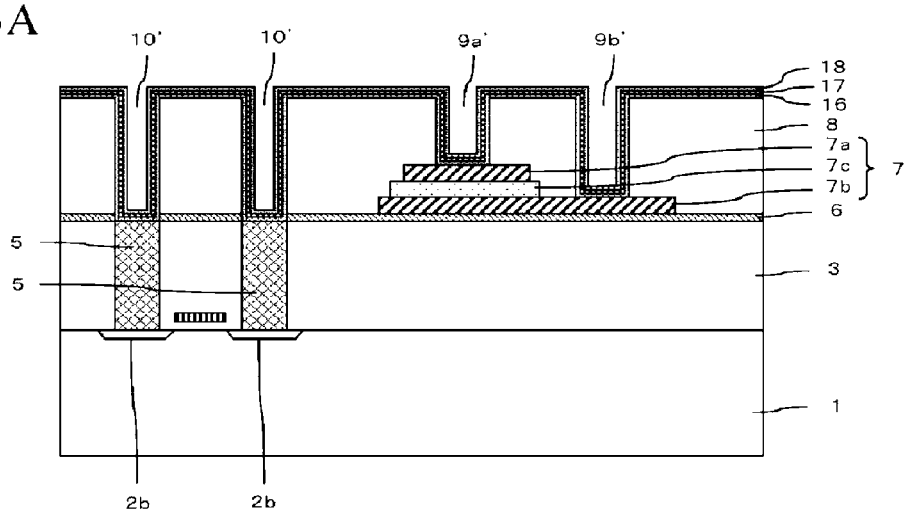
FIGS. 13A to 13C are diagrams showing steps of forming a semiconductor device in accordance with the third embodiment of the present invention.

After the contact hole 10' exposing an upper side of the plug 5 is formed as shown in FIG. 3C, a barrier film 16 is formed with a sputtering method as shown in FIG. 13A, so that it covers an upper side of an insulating film 8, and the interior of contact holes 9a', 9b', and 10'. The barrier film 16 is a conducting film which inhibits chemical reactions between the upper electrode 7a and the wiring film 12 that is described below. TiN is used as the barrier film 16, and a TaN film of 75 nm in thickness is formed. For example, Ti is used as a sputtering target, and $N_2$ is used as a sputtering gas to form the TiN film. The conditions for forming the TiN film are set as follows. For example, the DC power is set to be 5 kW. The sputtering atmosphere pressure is set to be 7 mTorr. The temperature for forming the film is set to be 100 degrees Celsius. Next, the barrier film 17 is formed on the barrier film 16. The barrier film 17 is either a laminated film of $TiO_2$ and $Ti_xO_yN_z$ or a single layer film of $Ti_xO_yN_z$. The thickness of the barrier film 17 at the bottom of the contact holes 9a' and 9b' is a few nm to 20 nm. For example, the barrier film 17 is formed by conducting a heat treatment in an atmosphere including $O_2$ at 300-450 degrees Celsius for 1-30 minutes after the barrier film 16 comprised of TiN is formed. Either a furnace or a lamp anneal device may be used as the heat treatment device. Also, a plasma treatment in an atmosphere including $O_2$ may be conducted with an ashing device. Next, the barrier film 18 is formed on the barrier film 17 with a sputtering method. As with the barrier film 16, the barrier film 18 is a conducting film which inhibits chemical reactions between the upper electrode 7a and the wiring film 12 described below. TiN is used as the barrier film 18 and a TiN film of 75 nm in thickness is formed. For example, Ti is used as a sputtering target and $N_2$ is used as a sputtering gas. The conditions for forming the barrier film 18 are set as follows. For example, the DC power is set to be 5 kW. The sputtering atmosphere pressure is set to be 7 mTorr. The temperature for forming the film is set to be 100 degrees Celsius.

As shown in FIG. 12A, the structure of the barrier films can be a structure in which plural barrier films 17 (i.e., a laminated film of $Ti_xO_yN_z$ and $TiO_2$ or a single layer film of $Ti_xO_yN_z$) are formed between a barrier film 16 (i.e., TiN) of the bottom layer and a barrier film 18 (TiN) of the top layer. Also, as shown in FIG. 12B, it can be a structure in which a barrier film 17 (i.e., a laminated film of $Ti_xO_yN_z$ and $TiO_2$ or a single layer film of $Ti_xO_yN_z$) is formed on a barrier film 16 of nearly 150 nm in thickness.

Figure 13B:
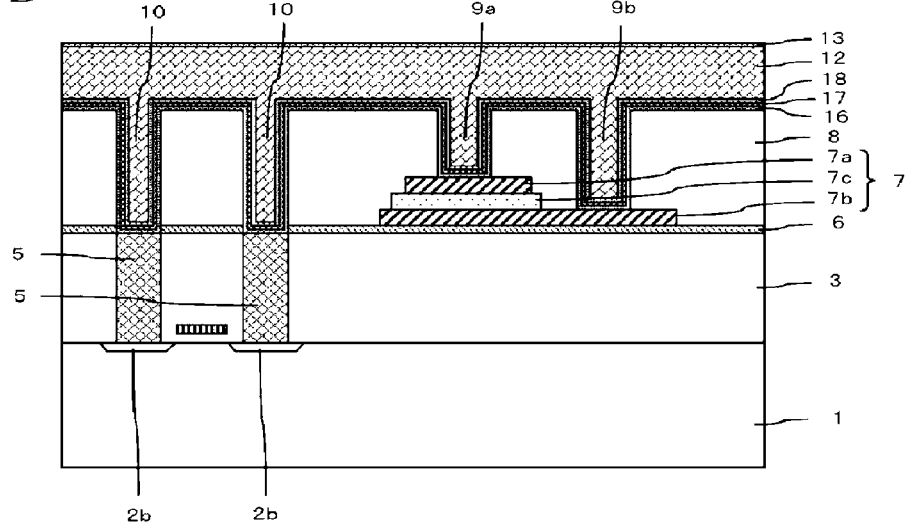

Next, as shown in FIG. 13B, a wiring film 12 and a conducting film 13 are sequentially formed on the barrier film 18 with a sputtering method. Al alloy is used for the wiring film 12. The Al alloy film is formed in two steps. In the first step of forming the Al alloy film, Al alloy is used as a sputtering target and Ar is used as a sputtering gas, for instance. The conditions for forming the Al alloy film are set as follows. For example, the DC power is set to be 9 kW. The sputtering atmosphere pressure is set to be 3 mTorr. The temperature for forming the film is set to be 400 degrees Celsius. In the second step of forming the Al alloy film, Al alloy is used as a sputtering target and Ar is used as a sputtering gas, for instance. The conditions for forming the Al alloy film are set as follows. For example, the DC power is set to be 2 kW. The sputtering atmosphere pressure is set to be 3 mTorr. The temperature for forming the film is set to be 400 degrees Celsius. Also, instead of using Al alloy, Al, Cu, or an alloy whose main constituent is Cu, can be used as a material of the wiring film 12. The conducting film 13 is an antireflection film with respect to the Al alloy wiring film 12. The conducting film 13 is comprised of TiN. For example, Ti is used as a sputtering target and $N_2$ is used as a sputtering gas to form a TiN film. The conditions for forming the TiN film are set as follows. For example, the DC power is set to be 5 kW. The sputtering atmosphere pressure is set to be 7 mTorr. The temperature for forming the film is set to be 100 degrees Celsius. In this phase, Al alloy is implanted into the contact holes 9a', 9b' and 10', and contacts 9a, 9b, and 10 that are integral with the wiring film 12 are formed.

Figure 13C:
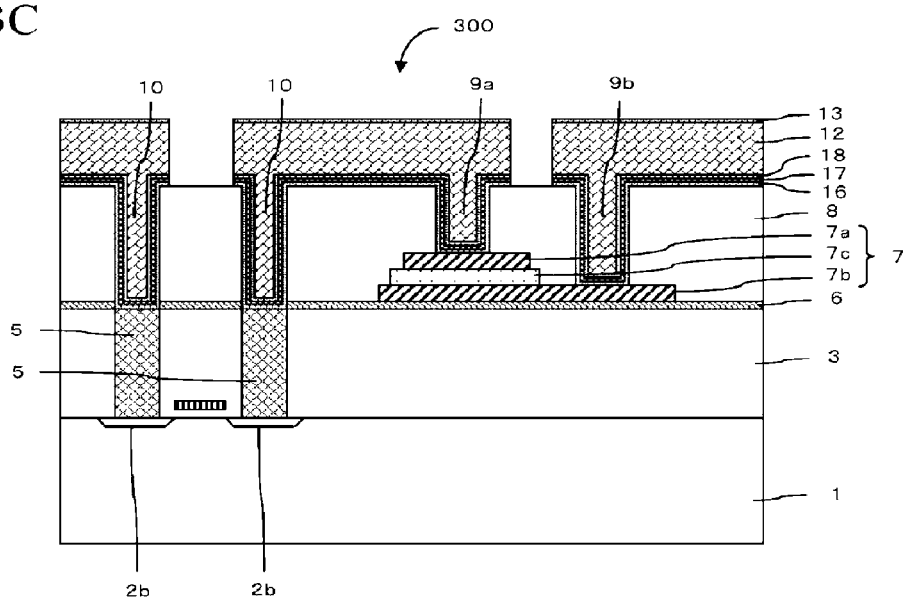

Next, as shown in FIG. 13C, patterning is conducted for the barrier film 16, the barrier film 17, the barrier film 18, the wiring film 12, and the conducting film 13 with potholithography and etching. For example, $BCl_3$ and $Cl_2$ are used as an etching gas. The conditions for the etching are set as follows. For example, gas flow rates of $BCl_3$ and $Cl_2$ are set to be 40 and 60 sccm, respectively. The RF power is set to be 70 W. The chamber pressure is set to be 1 Pa.

Subsequently, a ferroelectric memory cell 300 is formed by repeating the steps of forming an interlayer insulating film, an upper layer wiring, and so on. However, these steps are not directly related with the present invention. Therefore, explanation of these steps is omitted here.

Barrier Properties Assessment Test

Based on experimental data, the barrier effect of $Ti_xO_yN_z$/$TiO_2$, that is, the barrier effect of the oxidization of TiN, is explained here from the perspective of sheet resistance. Also, the following experimental results indicate a barrier effect of a laminated film of $Ti_xO_yN_z$/$TiO_2$. However, needless to say, a similar barrier effect can be obtained for a single layer film of $Ti_xO_yN_z$.

Figure 14A:
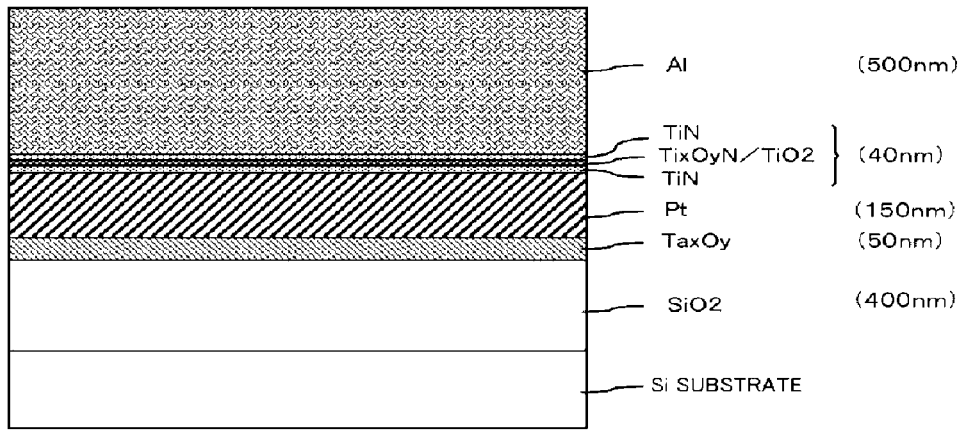
FIG. 14A is a diagram showing a structure of a sheet resistance assessment sample.

In this experiment, a resistance assessment sample that models a wiring structure shown in FIG. 14A is used. For example, the resistance assessment sample shown in FIG. 14A has a structure in which $SiO_2$, $Ta_xO_y$, Pt, TiN, $Ti_xO_yN_z$/$TiO_2$, TiN, and Al are sequentially laminated on a semiconductor substrate that is comprised of silicon (Si). Pt shown in FIG. 14A corresponds to the upper electrode 7a or the lower electrode 7b of the ferroelectric capacitor 7 in FIG. 11. Also, the lower layer TiN, $Ti_xO_yN_z$/$TiO_2$ and the upper layer TiN correspond to the barrier film 16, the barrier film 17, and the barrier film 18 shown in FIG. 11, respectively. The thickness of $SiO_2$, $Ta_xO_y$, Pt, and Al in a structure shown in FIG. 14A is set to be 400, 50, 150, and 500 nm respectively. Also, the thickness of the lower layer TiN, $Ti_xO_yN_z$/$TiO_2$, and the upper layer TiN is set to be 40 nm, which corresponds to thickness of a laminated film of the barrier films 16, 17, and 18 at the bottom of the contact hole 9a shown in FIG. 11.

Figure 14B:
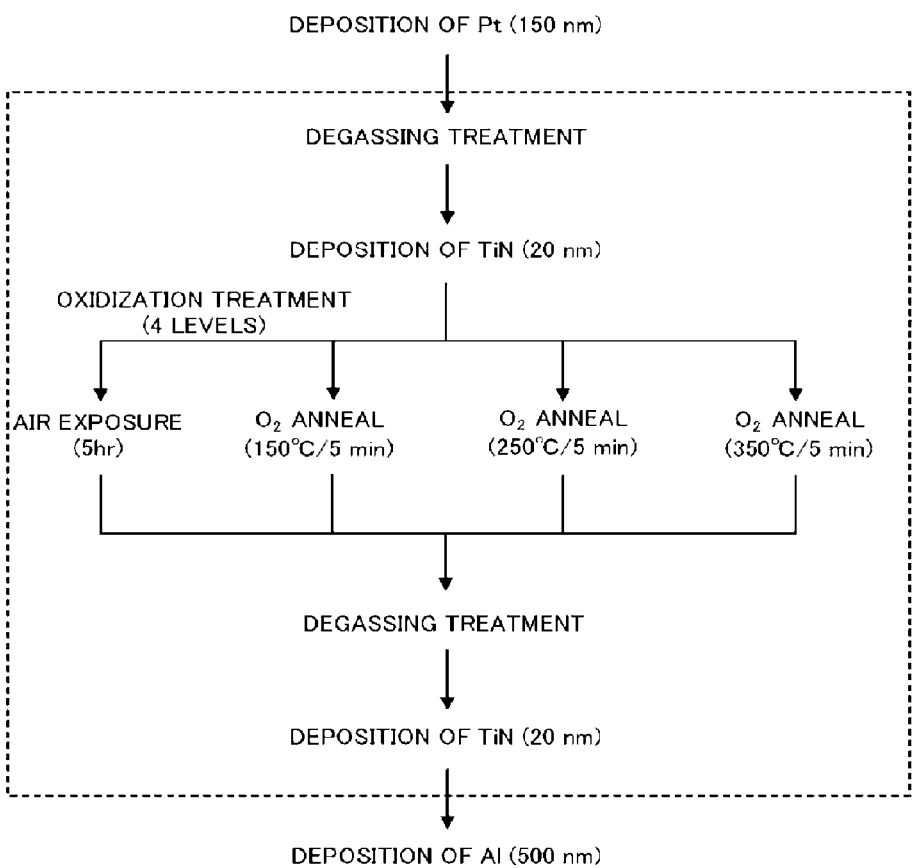
FIG. 14B is a diagram showing steps of forming an assessment sample.

FIG. 14B shows the manufacturing process of a resistance assessment sample shown in FIG. 14A. First, $SiO_2$, $Ta_xO_y$, and Pt are sequentially formed on a semiconductor substrate comprised of silicon. Then, the lower layer TiN 20 nm in thickness is deposited after a degassing treatment is conducted for the surface of the Pt.

Next, an assessment sample on which TiN is formed is oxidized in four-level oxidization treatment conditions shown in FIG. 14B. These conditions are comprised of 5-hour air exposure, $O_2$ anneal at 150 degrees Celsius for 5 minutes, $O_2$ anneal at 250 degrees Celsius for 5 minutes, and $O_2$ anneal at 350 degrees Celsius for 5 minutes. Through the oxidization treatment, $Ti_xO_yN_z$/$TiO_2$ is formed on the surface of TiN. Next, the upper layer TiN of 20 nm in thickness is deposited after a degassing treatment is conducted for the surface of $Ti_xO_yN_z$/$TiO_2$. Finally, Al of 500 nm in thickness is deposited. Thus, a resistance assessment sample shown in FIG. 14A is formed.

Figure 15:
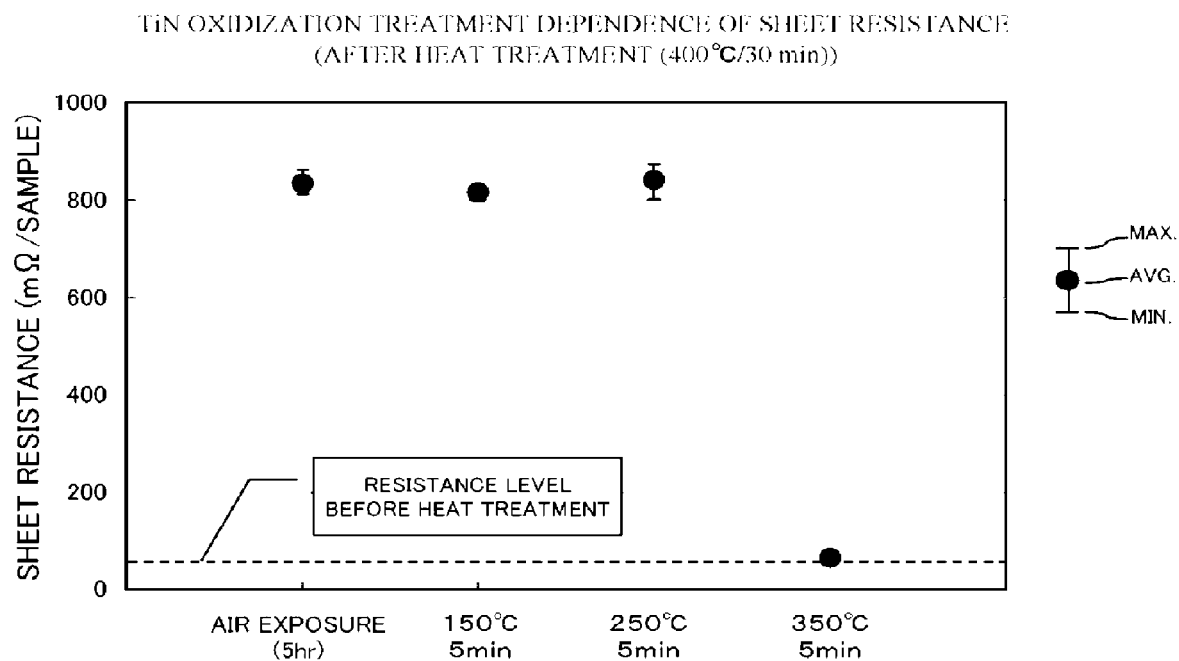
FIG. 15 is a diagram showing TiN oxidization treatment dependence of sheet resistance.
Figure 16A:
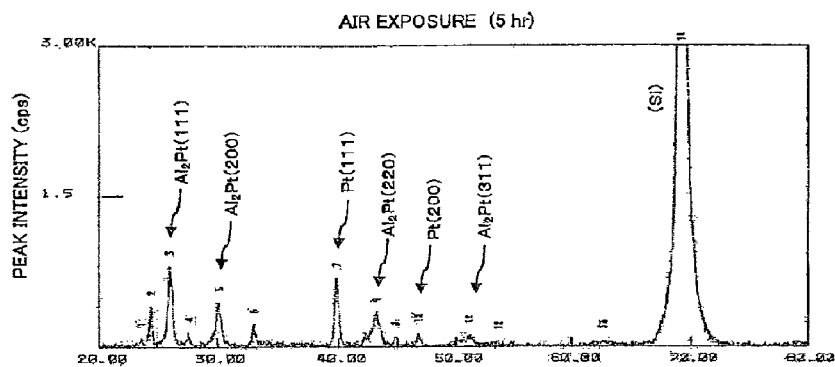
FIGS. 16A to 16D are diagrams showing x-ray diffraction data after a TiN oxidization treatment.
Figure 16B:
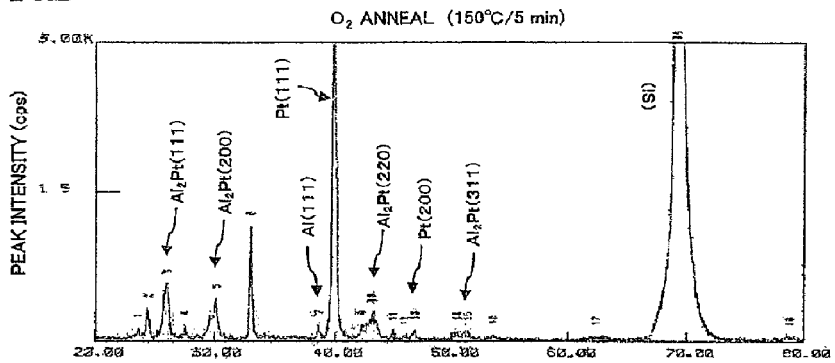
Figure 16C:
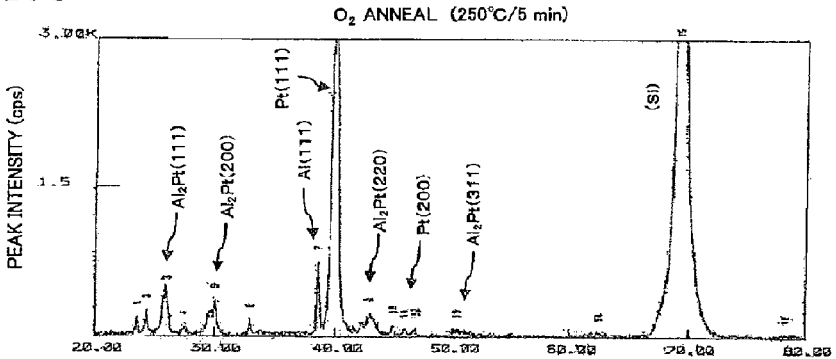
Figure 16D:
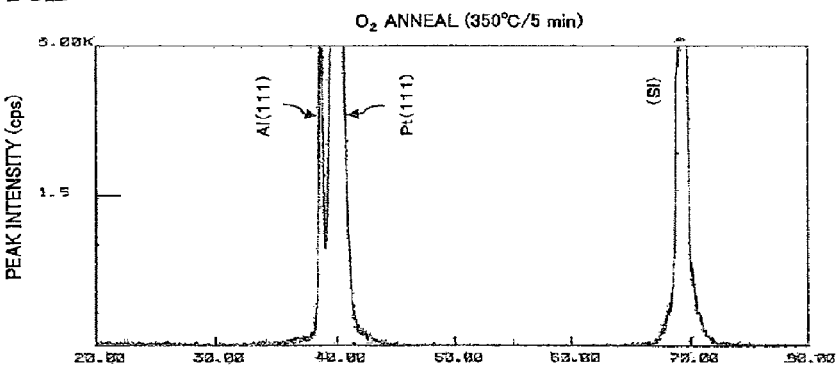

FIG. 15 shows sheet resistance after a heat treatment in an oxygen atmosphere at 400 degrees Celsius for 30 minutes is conducted for each of the resistance assessment samples formed with the above described four-level oxidization conditions shown in FIG. 14B. Also, data shown in FIG. 15 is obtained by measuring the sheet resistance at 6-10 points in each sheet of a resistance assessment sample formed with each level of four-level oxidization conditions, and indicates the average, maximum, and minimum sheet resistance. The resistance value level of sheet resistance before the heat treatment is conducted for a resistance assessment sample is also shown with a dotted line for comparison. FIG. 15 reveals that sheet resistance is substantially increased in the oxidization treatment of 5-hour air exposure, $O_2$ anneal at 150 degrees Celsius for 5 minutes, and $O_2$ anneal at 250 degrees Celsius for 5 minutes, after a heat treatment at 400 degrees Celsius for 30 minutes is conducted. This indicates that the $Al_2Pt$ compound is formed by chemical reactions between the lower layer Pt and the upper layer Al because the barrier effect of the $Ti_xO_yN_z$/$TiO_2$ formed by oxidizing TiN is insufficient. The details of this are given later with the x-ray diffraction data. On the other hand, in an oxidization treatment with $O_2$ anneal at 350 degrees Celsius for 5 minutes, the sheet resistance remains almost at the same level as that after the heat treatment. This indicates that chemical reactions between the lower layer Pt and the upper layer Al are effectively inhibited because the barrier effect of the $Ti_xO_yN_z$/$TiO_2$ formed by oxidizing TiN is sufficient. The details of this are given later with the x-ray diffraction data.

FIGS. 16A to 16D shows x-ray diffraction data after a heat treatment in oxygen atmosphere at 400 degrees Celsius for 30 minutes is conducted for each resistance assessment sample formed in the above described four-level oxidization treatment conditions. In FIGS. 16A to 16D, peaks of $Al_2Pt$ compound formed by chemical reactions between Pt and Al can be observed in the oxidization treatments of 5-hour air exposure, $O_2$ anneal at 150 degrees Celsius for 5 minutes, and $O_2$ anneal at 250 degrees Celsius for 5 minutes. This indicates that the lower layer Pt and the upper layer Al chemically react because the barrier effect of $Ti_xO_yN_z$/$TiO_2$ is insufficient. On the other hand, in an oxidization treatment of $O_2$ anneal at 350 degrees Celsius for 5 minutes, peaks of Al and Pt can be observed, but a peak of the $Al_2Pt$ compound cannot be observed. That indicates that chemical reactions between the lower layer Pt and the upper layer Al are effectively inhibited because the barrier effect of $Ti_xO_yN_z$/$TiO_2$ is sufficient.

Figure 17:
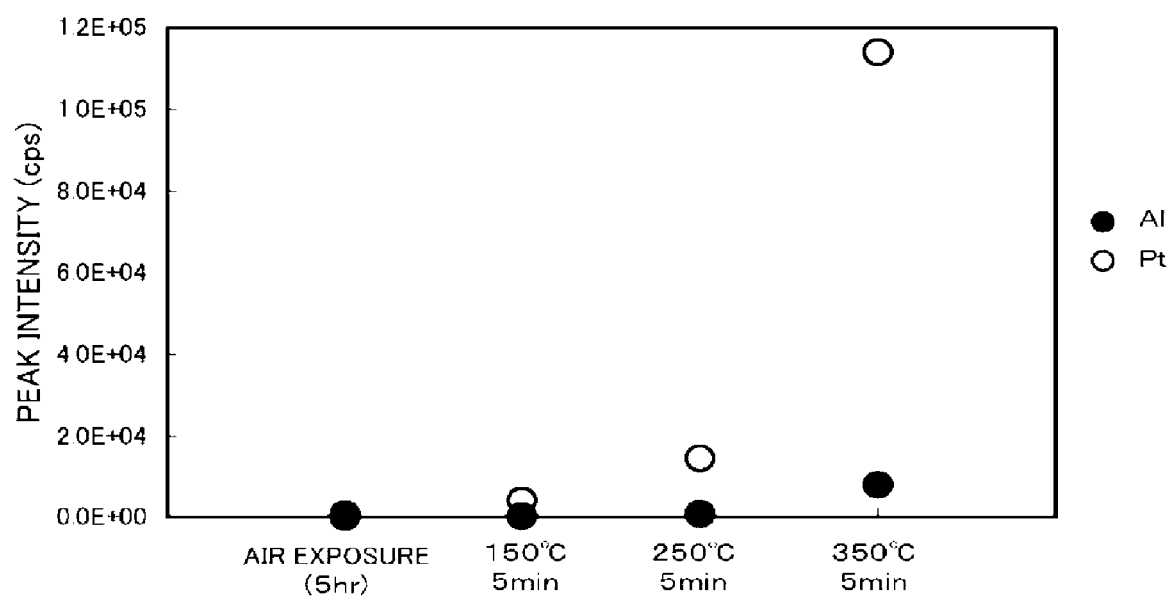
FIG. 17 is a diagram showing the relationship between peak intensity of Al and Pt in the x-ray diffraction data and a TiN oxidization treatment.

FIG. 17 shows the relationship between peak intensity of Al (111) and P(111) in the x-ray diffraction data shown in FIG. 16A to 16D and the oxidization treatment conditions of TiN. In FIG. 17, it can be seen that peak intensity of Al and Pt exhibits a declining tread as the treatment temperature in the oxidization treatments of TiN becomes lower.

As can be seen from the x-ray diffraction data shown in FIG. 16, this indicates that the $Al_2Pt$ compound is easily produced as the treatment temperature becomes lower, in other words, that Al and Pt chemically react easily. Also, in an oxidization treatment of 5-hour air exposure, it is clear that peak intensity of Al and that of Pt are the lowest, and it is understandable that an oxidization treatment of the surface of TiN is important and the barrier properties with respect to diffusion of Al is improved in a more oxidized structure.

From the above described experimental result, it is demonstrated that chemical reactions between Al and Pt are effectively inhibited by sufficient oxidization of surface of TiN. Because of this, a process of forming the barrier film 17 comprised of $Ti_xO_yN_z TiO_2$ or $Ti_xO_yN_z$, in other words, an oxidization treatment of the barrier film 16 comprised of TiN, is conducted in an oxygen atmosphere at 300-450 degrees Celsius for 1-30 minutes.

According to the semiconductor device in accordance with the third embodiment of the present invention, barrier films comprised of TiN, such as barrier films 16 and 18, and the barrier film 17, such as a laminated film comprised of $Ti_xO_yN_z/TiO_2$ or a single layer film of $Ti_xO_yN_z$ are formed between the upper electrode 7a (or the lower electrode 7b) comprised of Pt and the wiring film 12 mainly comprised of Al. Existence of the barrier film 17 makes the crystal grain boundary in the barrier film of TiN through which Al easily diffuses discontinuous. Because of this, the barrier properties with respect to diffusion of Al are improved, and chemical reactions between Al and Pt can be effectively inhibited. Furthermore, the barrier films 16, 17, and 18 are formed as a portion of a wiring structure. Therefore, surface unevenness is not encouraged and thickness of the whole structure is not increased by forming the barrier films 16, 17, and 18.

Fourth Embodiment

Capacitor Structure and Wiring Structure

Figure 18:
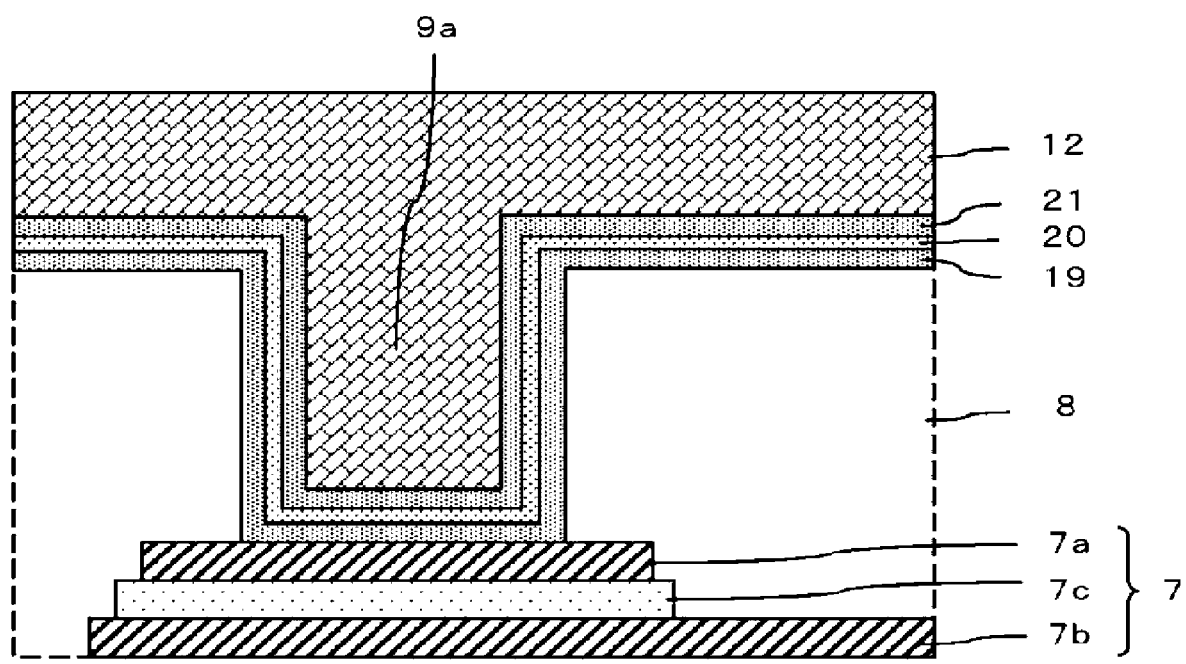
FIG. 18 is a schematic diagram showing the structure of a ferroelectric capacitor and its wiring structure used in a semiconductor device in accordance with a fourth embodiment of the present invention.

FIG. 18 is a schematic diagram showing a ferroelectric capacitor and its wiring structure in a semiconductor device in accordance with a fourth embodiment of the present invention. The ferroelectric capacitor and its wring structure in FIG. 18 include some elements that are also shown in FIG. 1. Therefore, each of these elements in FIG. 18 has the same number and/or symbol that are assigned to the corresponding elements in FIG. 1, and the description thereof will be partially omitted here.

A contact 9a is a connector for electrically connecting the ferroelectric capacitor 7 and external elements. The contact 9a is formed so as to be in contact with the upper electrode 7a through barrier films 19 and 21 and a reaction film 20 as a portion of a wiring film 12 formed on an insulating film 8. The barrier films 19 and 21 are conducting films which inhibit chemical reactions between the upper electrode 7a and the wiring film 12. It is required to be formed so as to be located between the upper electrode 7a and the wiring film 12 at the bottom of a contact 9a. The barrier films 19 and 21 are comprised of TiN. A reaction film 20 is a conducting film that forms an alloy layer by chemically reacting with the wiring film 12. As with the barrier films 19 and 21, the reaction film 20 is required to be formed so as to be located between the upper electrode 7a and the wiring film 12 at the bottom of the contact 9a. The reaction film 20 is comprised of Ti. The Ti of the reaction film 20 chemically reacts with Al at the temperature of the heat treatment in the manufacturing process, such as the temperature of forming an Al alloy film which is a main material of the wring film 12. Through the chemical reaction, an alloy layer such as $Al_3Ti$ is formed. At this time, the diffusion time of Al is delayed because a portion of Al is used for the chemical reaction with Ti. Also, the diffusion distance of Al is effectively prolonged because an alloy layer of Al and Ti is formed. It is also possible to use Mg, Mn, Ni, Hf, Li, Sc, Zr, Si, Pb, Nb, Zn, Sr, In, and Ag, instead of using Ti as the reaction film 20.

Figure 19A:
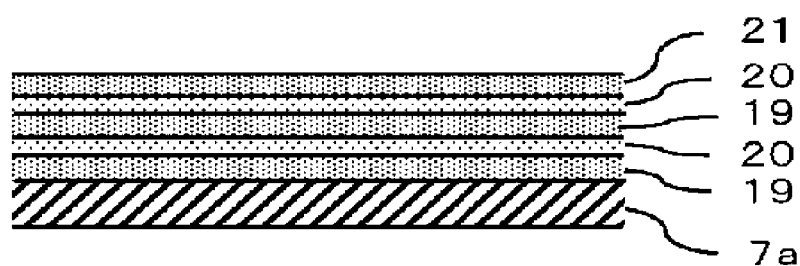
FIGS. 19A and 19B are diagrams showing other structures of a barrier film in accordance with the fourth embodiment of the present invention.
Figure 19B:
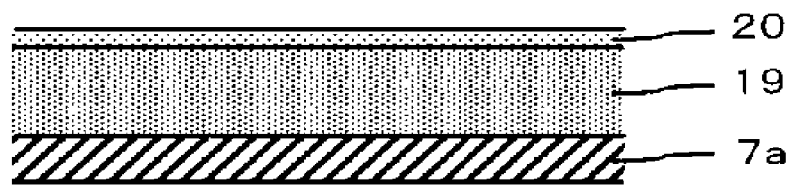

A structure of the barrier film and the reaction film in accordance with the fourth embodiment of the present invention is not limited to a three-layer structure comprised of the barrier film 19 (i.e., TiN), the reaction film 20 (i.e., Ti), and the barrier film 21 (i.e., TiN) as shown in FIG. 18. For example, as shown in FIG. 19A, it can be a structure in which plural reaction films 20 (i.e., Ti) are formed between a barrier film 19 (i.e., TiN) of the bottom layer and a barrier film 21 (i.e., TiN) of the top layer. Also, as shown in FIG. 19B, it can be a structure that a reaction film 20 (i.e., Ti) is formed on a thickly formed barrier film 19 (i.e., TiN).

Thus, in the ferroelectric capacitor and its wiring structure in accordance with the fourth embodiment of the present invention, the barrier film comprised of TiN, such as the barrier films 19 and 21, and the reaction film 20 comprised of Ti that chemically reacts with the wiring film 12 are formed between the upper electrode 7a comprised of Pt and the wiring film 12 mainly comprised of Al. The diffusion time of Al is delayed and the diffusion distance of Al is effectively lengthened by chemically reacting the reaction film 20 comprised of Ti with Al. Therefore, Al is effectively inhibited from reaching the surface of the Pt electrode. Also, the resistance value of Ti that is the material of the reaction film 20 is lower than that of $Ti_xO_yN_z/TiO_2$ or $Ti_xO_yN_z$ that is the material of the barrier film 17 of the third embodiment. Therefore, it is possible to reduce the resistance of contacts 9a and 9b.

Manufacturing Method

A manufacturing method of the ferroelectric capacitor and its wiring structure shown in FIG. 18, that is, a manufacturing method of a ferroelectric memory cell 400, includes the successive processes from a process of forming a MOS transistor 2 to a process of forming a contact hole 10' exposing an upper side of a plug 5. These processes are also included in the manufacturing method of the ferroelectric capacitor memory cell 100 of the first embodiment of the present invention as shown in FIGS. 2A to 3C. Therefore, explanation of these processes is omitted here. In the fourth embodiment of the present invention, the ferroelectric memory cell 400 is formed by conducting the processes shown in FIGS. 20A to 20C after the process of forming a contact hole 10' shown in FIG. 3C is completed.

Figure 20A:
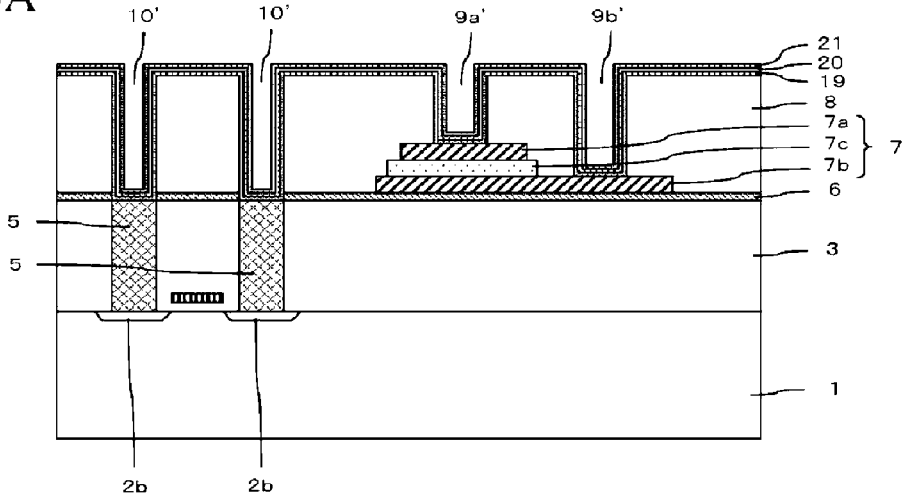
FIGS. 20A to 20C are diagrams showing steps of forming a semiconductor device in accordance with the fourth embodiment of the present invention.

After the contact hole 10' exposing an upper side of the plug 5 is formed as shown in FIG. 3C, a barrier film 19 is formed with a sputtering method as shown in FIG. 20A, so that it covers an upper side of an insulating film 8, and the interior of the contact holes 9a', 9b', and 10'. The barrier film 19 is a conducting film which inhibits chemical reactions between the upper electrode 7a and a wiring film 12 that is described below. TiN is used as the barrier film 16, and a TiN film of 75 nm in thickness is formed. For example, Ti is used as a sputtering target, and $N_2$ is used as a sputtering gas to form the TiN film. The conditions for forming the TiN film are set as follows. For example, the DC power is set to be 5 kW. The sputtering atmosphere pressure is set to be 7 mTorr. The temperature for forming the film is set to be 100 degrees Celsius. Next, the reaction film 20 is formed on the barrier film 19. The reaction film 20 is a conducting film that chemically reacts with the wiring film 12 that is described below. For example, Ti is used as the reaction film 20. The thickness of Ti at the bottom of contact holes 9a' and 9b' is set to be a few nm to 50 nm. For example, Ti is used as a sputtering target and Ar is used as a sputtering gas to form a Ti film. The conditions for forming the Ti film are set as follows. For example, the DC power is set to be 3 kW. The stage temperature is set to be 150 degrees Celsius. It is also possible to use Mg, Mn, Ni, Hf, Li, Sc, Zr, Si, Pb, Nb, Zn, Sr, In, and Ag, instead of using Ti as the reaction film 20.

Next, the barrier film 21 is formed on the reaction film 20 with a sputtering method. As with the barrier film 19, the barrier film 21 is a conducting film which inhibits chemical reactions between the upper electrode 7a and a wiring film 12 described below. TiN is used as the barrier film 21 and a TiN film of 75 nm in thickness is formed. For example, Ti is used as a sputtering target and $N_2$ is used as a sputtering gas. The conditions for forming the barrier film 21 are set as follows. For example, the DC power is set to be 5 kW. The sputtering atmosphere pressure is set to be 7 mTorr. The temperature for forming the film is set to be 100 degrees Celsius. As shown in FIG. 19A, structures of the barrier films 19 and 21 and the reaction film 20 can be a structure in which plural reaction films 20 (i.e., Ti) are formed between a barrier film 19 (i.e., TiN) of the bottom layer and a barrier film 21 (TiN) of the top layer. Also, as shown in FIG. 19B, it can be a structure in which a reaction film 20 (i.e., Ti) is formed on a barrier film 19 of nearly 150 nm in thickness.

Figure 20B:
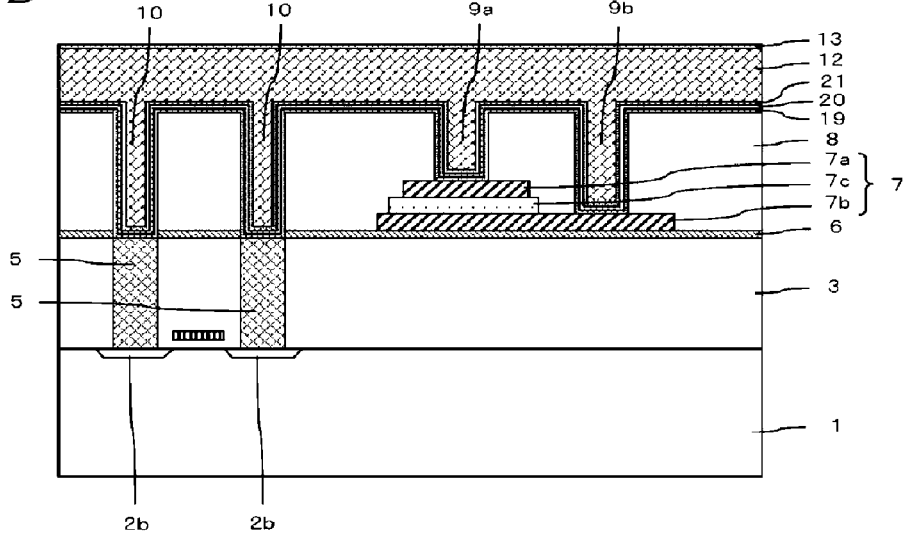

Next, as shown in FIG. 20B, a wiring film 12 and a conducting film 13 are sequentially formed on the barrier film 21 with a sputtering method. Al alloy is used for the wiring film 12. The Al alloy film is formed in two steps. In the first step of forming the Al alloy film, Al alloy is used as a sputtering target and Ar is used as a sputtering gas, for instance. The conditions for forming the Al alloy film are set as follows. For example, the DC power is set to be 9 kW. The sputtering atmosphere pressure is set to be 3 mTorr. The temperature for forming the film is set to be 400 degrees Celsius. In the second step of forming the Al alloy film, Al alloy is used as a sputtering target and Ar is used as a sputtering gas, for instance. The conditions for forming the Al alloy film are set as follows. For example, the DC power is set to be 2 kW. The sputtering atmosphere pressure is set to be 3 mTorr. The temperature for forming the film is set to be 400 degrees Celsius. Also, instead of using Al alloy, Al, Cu, or an alloy whose main constituent is Cu, can be used as a material of the wiring film 12. The conducting film 13 is an antireflection film with respect to the Al alloy wiring film 12. The conducting film 13 is comprised of TiN. For example, Ti is used as a sputtering target and $N_2$ is used as a sputtering gas to form a TiN film. The conditions for forming the TiN film are set as follows. For example, the DC power is set to be 5 kW. The sputtering atmosphere pressure is set to be 7 mTorr. The temperature for forming the film is set to be 100 degrees Celsius. In this phase, Al alloy is implanted into the contact holes 9a', 9b' and 10', and contacts 9a, 9b, and 10 that are integral with the wiring film 12 are formed.

Figure 20C:
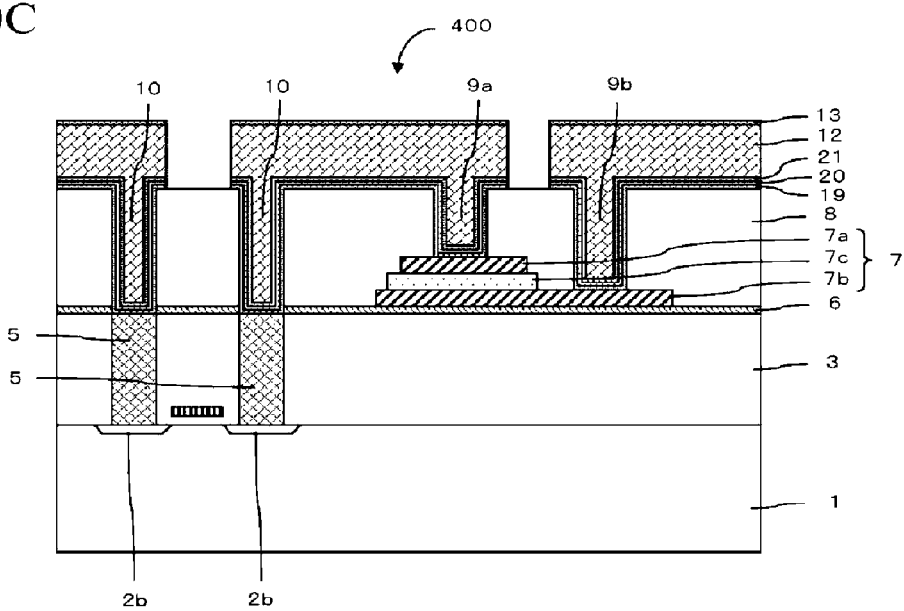

Next, as shown in FIG. 20C, patterning is conducted for the barrier film 19, the reaction film 20, the barrier film 21, the wiring film 12, and the conducting film 13 with photolithography and etching. For example, $BCl_3$ and $Cl_2$ are used as an etching gas. The conditions for the etching are set as follows. For example, gas flow rates of $BCl_3$ and $Cl_2$ are set to be 40 and 60 sccm, respectively. The RF power is set to be 70 W. The chamber pressure is set to be 1 Pa.

Subsequently, a ferroelectric memory cell 400 is formed by repeating steps of forming an interlayer insulating film, an upper layer wiring, and so on. However, these steps are not directly related with the present invention. Therefore, explanation of these steps is omitted here.

According to the semiconductor device in accordance with the fourth embodiment of the present invention, barrier films comprised of TiN, such as barrier films 19 and 21, and the reaction film 20 comprised of Ti that chemically reacts with the wiring film 12 are formed between the upper electrode 7a (or the lower electrode 7b) comprised of Pt and the wiring film 12 mainly comprised of Al. The diffusion time of Al is delayed and the diffusion distance of Al is effectively prolonged by chemically reacting Ti that is the material of the reaction film 20 and Al that is the material of the wiring film 20. Because of this, the barrier properties with respect to diffusion of Al are improved and chemical reactions between Al and Pt are effectively inhibited. Also, the resistance value of Ti that is material of the reaction film 20 is lower than that of $Ti_xO_yN_z/TiO_2$ or $Ti_xO_yN_z$ that is material of the barrier film 16 of the third embodiment of the present invention. Therefore, it is possible to further reduce the resistance of the contacts 9a and 9b, compared to the third embodiment. Furthermore, the barrier films 19 and 21, and the reaction film 20 are formed as a portion of a wiring structure. Therefore, surface unevenness is not encouraged and the thickness of the whole structure is not increased by forming barrier films 19 and 21 and the reaction film 20.

Fifth Embodiment

Capacitor Structure and Wiring Structure

Figure 21:
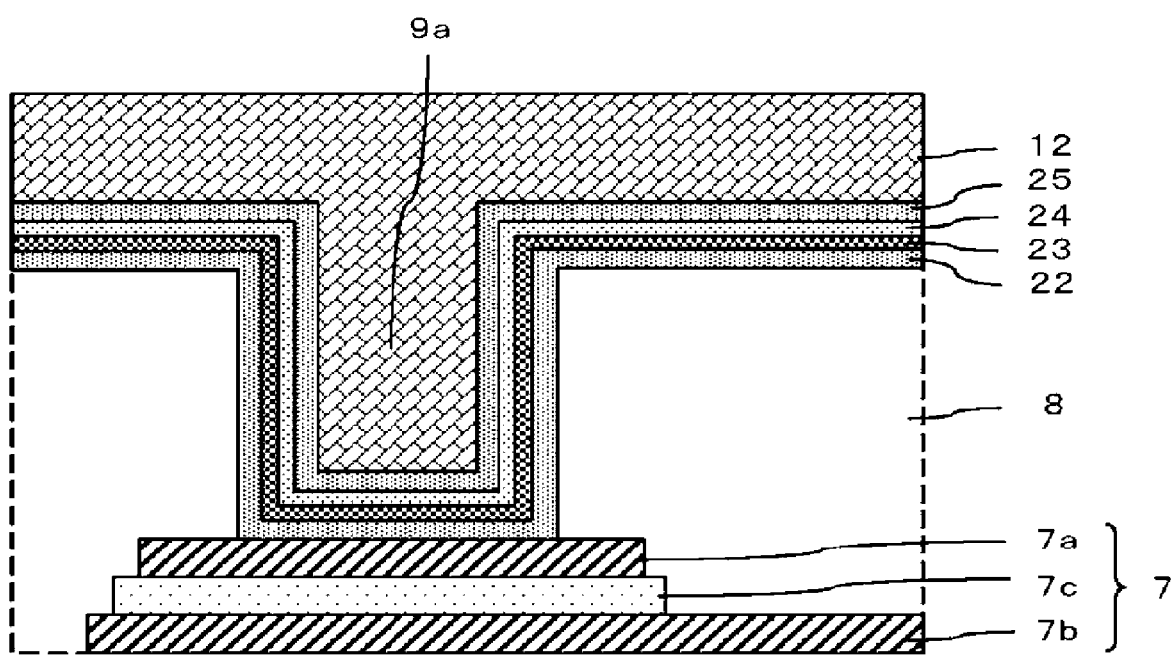
FIG. 21 is a schematic diagram showing the structure of a ferroelectric capacitor and its wiring structure used in a semiconductor device in accordance with a fifth embodiment of the present invention.

FIG. 21 is a schematic diagram showing a ferroelectric capacitor and its wiring structure in a semiconductor device in accordance with a fifth embodiment of the present invention. The ferroelectric capacitor and its wring structure in FIG. 21 include some elements that are also shown in FIG. 1. Therefore, each of these elements in FIG. 21 has the same number and/or symbol that are assigned to the corresponding elements in FIG. 1, and the description thereof will be partially omitted here.

A contact 9a is a connector for electrically connecting the ferroelectric capacitor 7 and external elements. The contact 9a is formed so as to be in contact with the upper electrode 7a through barrier films 22, 23 and 25 and a reaction film 24 as a portion of a wiring film 12 formed on an insulating film 8. The barrier films 22, 23, and 25 are conducting films which inhibit chemical reactions between the upper electrode 7a and the wiring film 12. They are required to be formed so as to be located between the upper electrode 7a and the wiring film 12 at the bottom of a contact 9a. The barrier films 22 and 25 are comprised of TiN. The barrier film 23 is either a laminated film of $TiO_2$ and $Ti_xO_yN_z$, or a single layer film of $Ti_xO_yN_z$. It is formed by oxidizing a barrier film 22 comprised of TiN. The barrier film 23, which is either a laminated film of $TiO_2$ and $Ti_xO_yN_z$ or a single layer film of $Ti_xO_yN_z$, has an effect that makes the crystal grain boundary of the barrier film 22 comprised of TiN discontinuous. Also, the barrier film 23 itself has the effect of inhibiting diffusion of Al.

A reaction film 24 is a conducting film that forms an alloy layer by chemically reacting with the wiring film 12. As with the barrier films 22, 23, and 25, the reaction film 24 is required to be formed so as to be located between the upper electrode 7a and the wiring film 12 at the bottom of the contact 9a. The reaction film 24 is comprised of Ti. Ti of the reaction film 24 chemically reacts with Al at the temperature of the heat treatment in the manufacturing process, such as the temperature at which an Al alloy film which is a main material of the wring film 12 is formed. Through the chemical reaction, an alloy layer such as $Al_3Ti$ is formed. At this time, the diffusion time of Al is delayed because a portion of Al is used for the chemical reaction with Ti. Also, the diffusion distance of Al is effectively lengthed because an alloy layer of Al and Ti is formed. It is also possible to use Mg, Mn, Ni, Hf, Li, Sc, Zr, Si, Pb, Nb, Zn, Sr, In, and Ag, instead of using Ti as the reaction film 24.

The structure of the barrier films 22 23, and 25, and the reaction film 24 is not limited to a four-layer structure comprised of the barrier film 22 (i.e., TiN), the barrier film 23 (i.e., a laminated film of $Ti_xO_yN_z$ and $TiO_2$ or a single layer film of $Ti_xO_yN_z$), the reaction film 24 (i.e., Ti), and the barrier film 25 (i.e., TiN), as shown in FIG. 21.

Figure 22A:
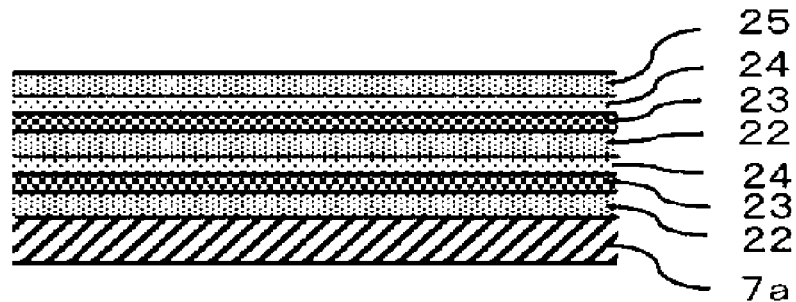
FIGS. 22A and 22B are diagrams showing other structures of a barrier film in accordance with the fifth embodiment of the present invention.
Figure 22B:
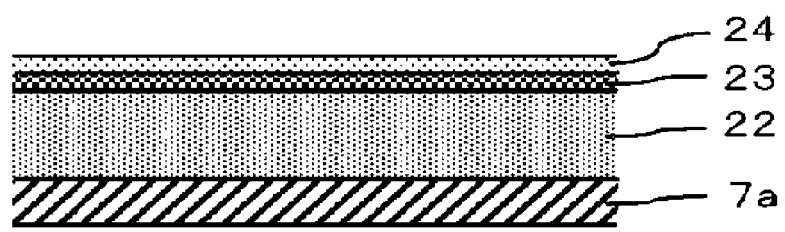

For example, as shown in FIG. 22A, it can be a structure in which plural barrier films 23 (i.e., a laminated film of $Ti_xO_yN_z$ and $TiO_2$ or a single layer film of $Ti_xO_yN_z$) and the reaction film 24 (i.e., Ti) are formed between a barrier film 22 (i.e., TiN) of the bottom layer and a barrier film 25 (i.e., TiN) of the top layer. Also, as shown in FIG. 22B, it can be a structure in which a barrier film 23 (i.e., a laminated film of $Ti_xO_yN_z$ and $TiO_2$ or a single layer film of $Ti_xO_yN_z$) and the reaction film 24 (i.e., Ti) are formed on a thickly formed barrier film 22 (i.e., TiN).

Thus, in the ferroelectric capacitor and its wiring structure in accordance with the fifth embodiment of the present invention, the barrier film comprised of TiN such as the barrier films 22 and 25, the barrier film 23 of a laminated film of $TiO_2$ and $Ti_xO_yN_z$ or a single layer film of $Ti_xO_yN_z$, and the reaction film 24 comprised of Ti that chemically reacts with the wiring film 12 are formed between the upper electrode 7a comprised of Pt and the wiring film 12 mainly comprised of Al. The existence of the barrier film 23 comprised of $Ti_xO_yN_z/TiO_2$ or $Ti_xO_yN_z$ makes the crystal grain boundary in a barrier film comprised of TiN through which Al easily diffuses discontinuous. Furthermore, the diffusion time of Al is delayed and the diffusion distance of Al is effectively lengthened by chemically reacting the reaction film 24 comprised of Ti with Al. Because of these synergistic effects, Al is effectively inhibited from reaching the surface of the Pt electrode.

Also, the following can be seen when the fourth embodiment and the third embodiment are compared. That is, the thickness of the barrier film 23 (i.e., $Ti_xO_yN_z/TiO_2$ or $Ti_xO_yN_z$) can be further reduced compared to that of the barrier film 17 (i.e., $Ti_xO_yN_z/TiO_2$ or $Ti_xO_yN_z$) of the third embodiment of the present invention, because the reaction film 24 is formed between the barrier films 22 and 25 comprised of TiN in addition to the barrier film 23. Because of this, resistance of the contacts 9a and 9b can be further reduced compared to the third embodiment. Also, the following can be seen when the fifth embodiment and the fourth embodiment shown in FIG. 18 are compared. That is, in the fifth embodiment, the barrier properties with respect to diffusion of Al can be further improved compared to the fourth embodiment, because the barrier film 23 comprised of $Ti_xO_yN_z/TiO_2$ or $Ti_xO_yN_z$ is formed between the barrier films 22 and 25 comprised of TiN in addition to the reaction film 24 comprised of Ti.

Manufacturing Method

The manufacturing method of the ferroelectric capacitor and its wiring structure shown in FIG. 21, that is, the manufacturing method of a ferroelectric memory cell 500, includes the successive processes from a process of forming a MOS transistor 2 to a process of forming a contact hole 10' exposing an upper side of a plug 5. These processes are also included in the manufacturing method of the ferroelectric capacitor memory cell 100 of the first embodiment of the present invention as shown in FIGS. 2A to 3C. Therefore, explanation of these processes is omitted here. In the fifth embodiment of the present invention, the ferroelectric memory cell 500 is formed by the conducting processes shown in FIGS. 23A to 23C after the process of forming a contact hole 10' shown in FIG. 3C is completed.

Figure 23A:
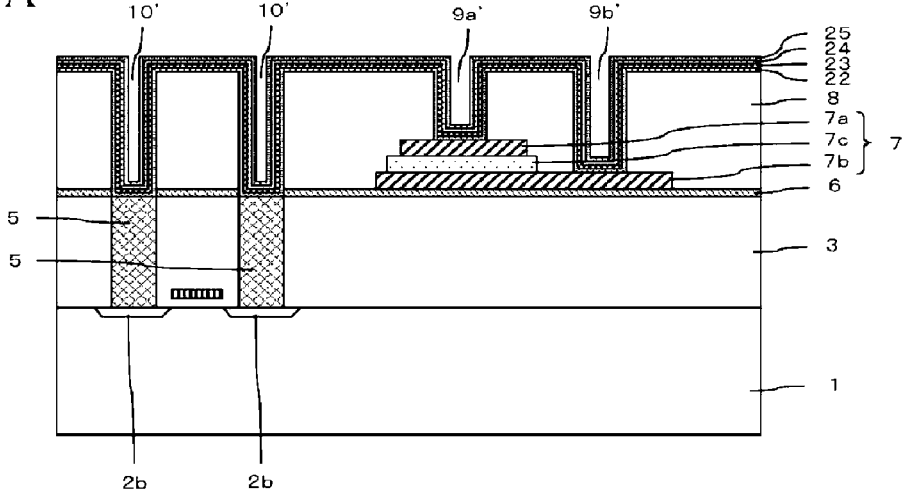
FIGS. 23A to 23C are diagrams showing steps of forming a semiconductor device in accordance with the fifth embodiment of the present invention.

After the contact hole 10' exposing an upper side of the plug 5 is formed as shown in FIG. 3C, a barrier film 22 is formed with a sputtering method as shown in FIG. 23A, so that it covers an upper side of an insulating film 8, and the interior of contact holes 9a', 9b', and 10'. The barrier film 22 is a conducting film which inhibits chemical reactions between the upper electrode 7a and the wiring film 12 that is described below. TiN is used as the barrier film 22, and a TiN film of 75 nm in thickness is formed. For example, Ti is used as a sputtering target, and $N_2$ is used as a sputtering gas to form the TiN film. The conditions for forming the TiN film are set as follows. For example, the DC power is set to be 5 kW. The sputtering atmosphere pressure is set to be 7 mTorr. The temperature for forming the film is set to be 100 degrees Celsius. Next, the barrier film 23 is formed on the barrier film 22. The barrier film 23 is either a laminated film of $TiO_2$ and $Ti_xO_yN_z$ or a single layer film of $Ti_xO_yN_z$. Thickness of the barrier film 23 at the bottom of the contact holes 9a' and 9b' is a few nm to 10 nm. For example, the barrier film 23 is formed by conducting a heat treatment in an atmosphere including $O_2$ at 300-450 degrees Celsius for 1-30 minutes after the barrier film 22 comprised of TiN is formed. Either a furnace or a lamp anneal device may be used as the heat treatment device. Also, a plasma treatment in an atmosphere including $O_2$ may be conducted with an ashing device. Next, the reaction film 24 is formed on the barrier film 23. The reaction film 24 is a conducting film that chemically reacts with the wiring film 12 that is described below. For example, Ti is used as the reaction film 24. Thickness of Ti at the bottom of contact holes 9a' and 9b' is set to be a few nm to 50 nm. For example, Ti is used as a sputtering target and Ar is used as a sputtering gas to form a Ti film. The conditions for forming the Ti film are set as follows. For example, the DC power is set to be 3 kW. The stage temperature is set to be 150 degrees Celsius. It is also possible to use Mg, Mn, Ni, Hf, Li, Sc, Zr, Si, Pb, Nb, Zn, Sr, In, and Ag, instead of using Ti as the reaction film 24. Next, the barrier film 25 is formed on the reaction film 24 with a sputtering method. As with the barrier film 22, the barrier film 25 is a conducting film to inhibit chemical reactions between the upper electrode 7a and the wiring film 12 described below. TiN is used as the barrier film 25 and a TiN film of 75 nm in thickness is formed. For example, Ti is used as a sputtering target and $N_2$ is used as a sputtering gas to form the TiN film. The conditions for forming the barrier film 25 are set as follows. For example, the DC power is set to be 5 kW. The sputtering atmosphere pressure is set to be 7 mTorr. The temperature for forming the film is set to be 100 degrees Celsius.

As shown in FIG. 22A, the barrier films 22, 23, and 25, and the reaction film 24 can be a structure in which plural barrier films 23 (i.e., $Ti_xO_yN_z/TiO_2$ or $Ti_xO_yN_z$) and a reaction film 24 (i.e., Ti) are formed between a barrier film 22 (i.e., TiN) of the bottom layer and a barrier film 25 (TiN) of the top layer. Also, as shown in FIG. 22B, it can be a structure in which a barrier film 23 (i.e., $Ti_xO_yN_z/TiO_2$ or $Ti_xO_yN_x$) and a reaction film 24 (i.e., Ti) are formed on a barrier film 22 of nearly 150 nm in thickness.

Figure 23B:
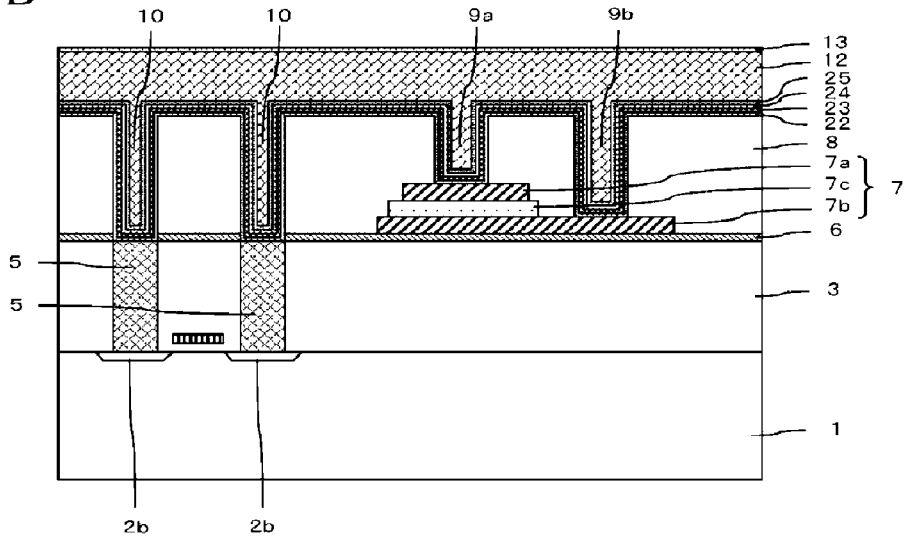

Next, as shown in FIG. 23B, a wiring film 12 and a conducting film 13 are sequentially formed on the barrier film 25 with a sputtering method. Al alloy is used for the wiring film 12. The Al alloy film is formed in two steps. In the first step of forming the Al alloy film, Al alloy is used as a sputtering target and Ar is used as a sputtering gas, for instance. The conditions for forming the Al alloy film are set as follows. For example, the DC power is set to be 9 kW. The sputtering atmosphere pressure is set to be 3 mTorr. The temperature for forming the film is set to be 400 degrees Celsius. In the second step of forming the Al alloy film, Al alloy is used as a sputtering target and Ar is used as a sputtering gas, for instance. The conditions for forming the Al alloy film are set as follows. For example, the DC power is set to be 2 kW. The sputtering atmosphere pressure is set to be 3 mTorr. The temperature for forming the film is set to be 400 degrees Celsius. Also, instead of using Al alloy, Al, Cu, or an alloy whose main constituent is Cu, can be used as a material of the wiring film 12. The conducting film 13 is an antireflection film with respect to the Al alloy wiring film 12. The conducting film 13 is comprised of TiN. For example, Ti is used as a sputtering target and $N_2$ is used as a sputtering gas to form a TiN film. The conditions for forming the TiN film are set as follows. For example, the DC power is set to be 5 kW. The sputtering atmosphere pressure is set to be 7 mTorr. The temperature for forming the film is set to be 100 degrees Celsius. In this phase, Al alloy is implanted into the contact holes 9a', 9b' and 10', and contacts 9a, 9b, and 10 that are integral with the wiring film 12 are formed.

Figure 23C:
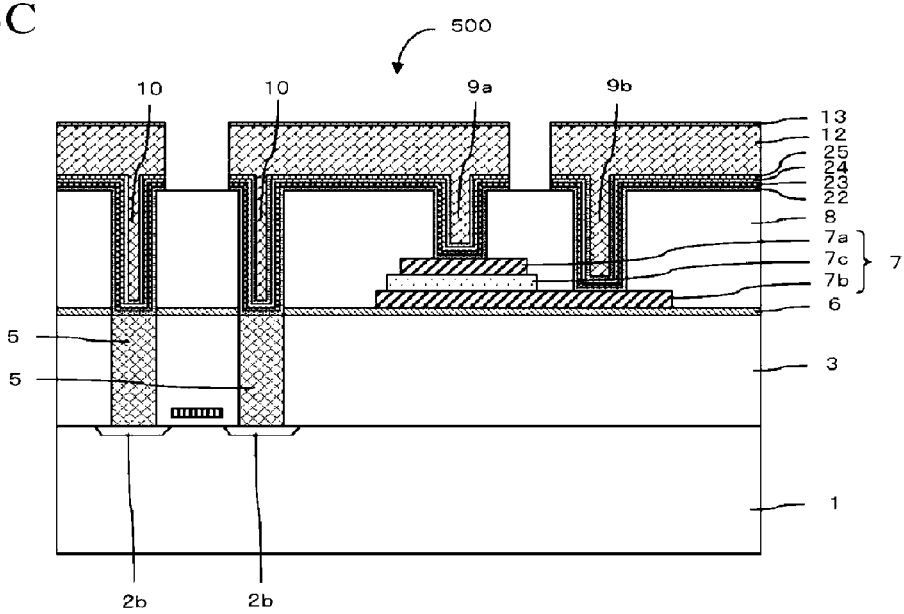

Next, as shown in FIG. 23C, patterning is conducted for the barrier film 22, the barrier film 23, the reaction film 24, the barrier film 25, the wiring film 12, and the conducting film 13 with photolithography and etching. For example, $BCl_3$ and $Cl_2$ are used as an etching gas. The conditions for the etching are set as follows. For example, the gas flow rates of $BCl_3$ and $Cl_2$ are set to be 40 and 60 sccm, respectively. The RF power is set to be 70 W. The chamber pressure is set to be 1 Pa.

Subsequently, a ferroelectric memory cell 500 is formed by repeating the steps of forming an interlayer insulating film, an upper layer wiring, and so on. However, these steps are not directly related with the present invention. Therefore, explanation of these steps is omitted here.

According to a semiconductor device in accordance with the fifth embodiment of the present invention, barrier films comprised of TiN such as barrier films 22 and 25, and the barrier film 23 such as a laminated film comprised of $Ti_xO_yN_z$/$TiO_2$ or a single layer film of $Ti_xO_yN_z$, and the reaction film 24 comprised of Ti that chemically reacts with the wiring film 12 are formed between the upper electrode 7a (or the lower electrode 7b) comprised of Pt and the wiring film 12 mainly comprised of Al. The existence of the barrier film 23 makes the crystal grain boundary in a barrier film of TiN through which Al easily diffuses discontinuous. Furthermore, the diffusion time of Al is delayed and the diffusion distance of Al is effectively lengthened by chemically reacting Ti that is the material of the reaction film 24 and Al that is the main material of the wiring film 12. Because of these synergistic effects, the barrier properties with respect to the diffusion of Al can be improved and chemical reactions between Al and Pt can be effectively inhibited. Also, the following can be seen when the fifth embodiment and the third embodiment shown in FIG. 11 are compared. That is, in the fifth embodiment, the thickness of the barrier film 23 (i.e., $Ti_xO_yN_z$/$TiO_2$ or $Ti_xO_yN_z$) can be further reduced compared to that of the barrier film 17 (i.e., $Ti_xO_yN_z$/$TiO_2$ or $Ti_xO_yN_z$) of the third embodiment, because the reaction film 24 comprised of Ti is formed between the barrier films 22 and 25 comprised of TiN in addition to the barrier film 23 comprised of $Ti_xO_yN_z$/$TiO_2$ or $Ti_xO_yN_z$. Because of this, in the fifth embodiment, the resistance of contacts 9a and 9b can be further reduced compared to the third embodiment. Also, the following can be seen when the fifth embodiment and the fourth embodiment shown in FIG. 18 are compared. In the fifth embodiment, the barrier film 23 comprised of $Ti_xO_yN_z$/$TiO_2$ or $Ti_xO_yN_z$ is formed between the barrier film 22 and the barrier film 25 in addition to the reaction film 24 comprised of Ti. Because of this, the barrier properties with respect to diffusion of Al can be further improved compared to the fourth embodiment. Furthermore, in the fifth embodiment, the barrier films 22, 23, and 24 are formed as a portion of a wiring structure. Therefore, surface unevenness is not encouraged and the thickness of the whole structure will not be thickly formed by forming the barrier films 22, 23, 25 and the reaction film 24.

This application claims priority to Japanese Patent Application No. 2005-018390. The entire disclosure of Japanese Patent Application No. 2005-018390 is hereby incorporated herein by reference.

The terms of degree, such as "nearly," "sufficiently," and "substantially," used herein mean a reasonable amount of deviation of the modified term such that the end result is not significantly changed. For example, the terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor device, comprising:
   a semiconductor substrate;
   a first electrode that is formed over said semiconductor substrate;
   a capacitive insulating film that is formed on said first electrode and is comprised of a metal oxide ferroelectric;
   a second electrode that is formed on said capacitive insulating film;
   an insulating film that has a first opening which exposes a portion of an upper side of said second electrode and is formed so as to cover said first electrode, said capacitive insulating film, and said second electrode;
   a first barrier film that is formed inside said first opening and on said insulating film;
   a second barrier film that is formed by oxidizing a surface of said first barrier film; and
   a wiring film that is formed above said first barrier film and said second barrier film, and is electrically connected to the second electrode through the first and second barrier films,
   wherein the wiring film, the first barrier film and the second barrier film constitute one interconnection layer,
   wherein said first barrier film is comprised of TiN, and
   wherein said second barrier film is either a laminated film comprised of $TiO_2$ and $Ti_xO_yN_z$ or a single layer film comprised of $Ti_xO_yN_z$.

2. The semiconductor device according to claim 1, further comprising a second opening which exposes a portion of an upper side of said first electrode, and wherein said first barrier film and said second barrier film are formed inside said second opening.

3. The semiconductor device according to claim 2, further comprising a reaction film provided on said second barrier film.

4. The semiconductor device according to claim 1, further comprising a reaction film provided on said second barrier film.

5. The semiconductor device according to claim 4, wherein said reaction film is comprised of at least one material selected from the group consisting of Ti, Mg, Mn, Ni, Hf, Li, Sc, Zr, Si, Pb, Nb, Zn, Sr, In, and Ag, and forms an alloy layer by chemically reacting with said wiring film.

* * * * *